US010196260B2

United States Patent
Hatcher, Jr. et al.

(10) Patent No.: US 10,196,260 B2
(45) Date of Patent: Feb. 5, 2019

(54) WAFER-LEVEL PACKAGE WITH ENHANCED PERFORMANCE

(71) Applicant: Qorvo US, Inc., Greensboro, NC (US)

(72) Inventors: Merrill Albert Hatcher, Jr., Greensboro, NC (US); Jonathan Hale Hammond, Oak Ridge, NC (US); Jon Chadwick, Greensboro, NC (US); Julio C. Costa, Oak Ridge, NC (US); Jan Edward Vandemeer, Kernersville, NC (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 15/676,415

(22) Filed: Aug. 14, 2017

(65) Prior Publication Data

US 2018/0044169 A1    Feb. 15, 2018

Related U.S. Application Data

(60) Provisional application No. 62/374,304, filed on Aug. 12, 2016.

(51) Int. Cl.
*H01L 23/31* (2006.01)
*H01L 23/00* (2006.01)
(Continued)

(52) U.S. Cl.
CPC ............ *B81B 7/007* (2013.01); *B81C 1/0023* (2013.01); *H01L 21/565* (2013.01);
(Continued)

(58) Field of Classification Search
CPC ............ H01L 23/3121; H01L 23/3114; H01L 23/3115; H01L 23/36; H01L 23/3737;
(Continued)

(56) References Cited

U.S. PATENT DOCUMENTS

| | | | |
|---|---|---|---|
| 4,093,562 | A | 6/1978 | Kishimoto |
| 4,366,202 | A | 12/1982 | Borovsky |

(Continued)

FOREIGN PATENT DOCUMENTS

| | | |
|---|---|---|
| CN | 103811474 A | 5/2014 |
| EP | 2996143 A1 | 3/2016 |

(Continued)

OTHER PUBLICATIONS

U.S. Appl. No. 14/261,029, filed Apr. 24, 2014; now U.S. Pat. No. 9,214,337.

(Continued)

*Primary Examiner* — Dao H Nguyen
(74) *Attorney, Agent, or Firm* — Withrow & Terranova, P.L.L.C.

(57) ABSTRACT

The present disclosure relates to a wafer-level package that includes a first thinned die, a multilayer redistribution structure, a first mold compound, and a second mold compound. The first thinned die resides over a top surface of the multilayer redistribution structure. The multilayer redistribution structure includes at least one support pad that is on a bottom surface of the multilayer redistribution structure and vertically aligned with the first thinned die. The first mold compound resides over the multilayer redistribution structure and around the first thinned die, and extends beyond a top surface of the first thinned die to define an opening within the first mold compound and over the first thinned die. The second mold compound fills the opening and is in contact with the top surface of the first thinned die.

22 Claims, 13 Drawing Sheets

(51) Int. Cl.
    *H01L 21/56*    (2006.01)
    *H01L 27/24*    (2006.01)
    *H05K 3/28*     (2006.01)
    *B81B 7/00*     (2006.01)
    *B81C 1/00*     (2006.01)
    *H01L 21/683*   (2006.01)

(52) U.S. Cl.
    CPC ........ *H01L 21/568* (2013.01); *H01L 21/6835* (2013.01); *H01L 23/3114* (2013.01); *H01L 23/3135* (2013.01); *H01L 24/19* (2013.01); *H01L 24/24* (2013.01); *B81B 2207/012* (2013.01); *B81C 2203/0154* (2013.01); *B81C 2203/0792* (2013.01); *H01L 2221/68359* (2013.01); *H01L 2224/24137* (2013.01); *H01L 2224/24195* (2013.01); *H01L 2924/14* (2013.01); *H01L 2924/1421* (2013.01); *H01L 2924/1461* (2013.01)

(58) Field of Classification Search
    CPC ... H01L 23/49822; H01L 24/19; H01L 24/24; H01L 27/24; H01L 21/565; H01L 21/568; H01L 21/6835; H05K 3/284; H05K 3/4697; H05K 1/183; B81B 7/007; B81C 1/0023
    USPC .............. 257/260, 415, 690, 712, 758, 774, 257/E23.011, E23.054, E23.055, E23.124, 257/E29.022, E29.034, E21.499, E21.502, 257/E21.503, E21.652, E21.655, E21.658
    See application file for complete search history.

(56) References Cited

U.S. PATENT DOCUMENTS

| | | |
|---|---|---|
| 5,061,663 A | 10/1991 | Bolt et al. |
| 5,069,626 A | 12/1991 | Patterson et al. |
| 5,391,257 A | 2/1995 | Sullivan et al. |
| 5,459,368 A | 10/1995 | Onishi et al. |
| 5,646,432 A | 7/1997 | Iwaki et al. |
| 5,648,013 A | 7/1997 | Uchida et al. |
| 5,699,027 A | 12/1997 | Tsuji et al. |
| 5,709,960 A | 1/1998 | Mays et al. |
| 5,831,369 A | 11/1998 | Fürbacher et al. |
| 5,920,142 A | 7/1999 | Onishi et al. |
| 6,072,557 A | 6/2000 | Kishimoto |
| 6,084,284 A | 7/2000 | Adamic, Jr. |
| 6,154,366 A | 11/2000 | Ma et al. |
| 6,154,372 A | 11/2000 | Kalivas et al. |
| 6,235,554 B1 | 5/2001 | Akram et al. |
| 6,236,061 B1 | 5/2001 | Walpita |
| 6,268,654 B1 | 7/2001 | Glenn et al. |
| 6,271,469 B1 | 8/2001 | Ma et al. |
| 6,423,570 B1 | 7/2002 | Ma et al. |
| 6,426,559 B1 | 7/2002 | Bryan et al. |
| 6,446,316 B1 | 9/2002 | Fürbacher et al. |
| 6,578,458 B1 | 6/2003 | Akram et al. |
| 6,649,012 B2 | 11/2003 | Masayuki et al. |
| 6,713,859 B1 | 3/2004 | Ma |
| 6,841,413 B2 | 1/2005 | Liu et al. |
| 6,864,156 B1 | 3/2005 | Conn |
| 6,902,950 B2 | 6/2005 | Ma et al. |
| 6,943,429 B1 | 9/2005 | Glenn et al. |
| 6,964,889 B2 | 11/2005 | Ma et al. |
| 6,992,400 B2 | 1/2006 | Tikka et al. |
| 7,042,072 B1 | 5/2006 | Kim et al. |
| 7,049,692 B2 | 5/2006 | Nishimura et al. |
| 7,109,635 B1 | 9/2006 | McClure et al. |
| 7,183,172 B2 | 2/2007 | Lee et al. |
| 7,288,435 B2 | 10/2007 | Aigner et al. |
| 7,307,003 B2 | 12/2007 | Reif et al. |
| 7,393,770 B2 | 7/2008 | Wood et al. |
| 7,427,824 B2 | 9/2008 | Iwamoto et al. |
| 7,596,849 B1 | 10/2009 | Carpenter et al. |
| 7,619,347 B1 | 11/2009 | Bhattacharjee |
| 7,635,636 B2 | 12/2009 | McClure et al. |
| 7,714,535 B2 | 5/2010 | Yamazaki et al. |
| 7,749,882 B2 | 7/2010 | Kweon et al. |
| 7,790,543 B2 | 9/2010 | Abadeer et al. |
| 7,855,101 B2 | 12/2010 | Furman et al. |
| 7,868,419 B1 | 1/2011 | Kerr et al. |
| 7,960,218 B2 | 6/2011 | Ma et al. |
| 8,183,151 B2 | 5/2012 | Lake |
| 8,420,447 B2 | 4/2013 | Tay et al. |
| 8,503,186 B2 | 8/2013 | Lin et al. |
| 8,643,148 B2 | 2/2014 | Lin et al. |
| 8,658,475 B1 | 2/2014 | Kerr |
| 8,664,044 B2 | 3/2014 | Jin et al. |
| 8,772,853 B2 | 7/2014 | Hong et al. |
| 8,791,532 B2 | 7/2014 | Graf et al. |
| 8,802,495 B2 | 8/2014 | Kim et al. |
| 8,816,407 B2 | 8/2014 | Kim et al. |
| 8,835,978 B2 | 9/2014 | Mauder et al. |
| 8,906,755 B1 | 12/2014 | Hekmatshoartabari et al. |
| 8,921,990 B2 | 12/2014 | Park et al. |
| 8,927,968 B2 | 1/2015 | Cohen et al. |
| 8,941,248 B2 | 1/2015 | Lin et al. |
| 8,963,321 B2 | 2/2015 | Lenniger et al. |
| 9,165,793 B1 | 10/2015 | Wang et al. |
| 9,214,337 B2 | 12/2015 | Carroll et al. |
| 9,368,429 B2 | 6/2016 | Ma et al. |
| 9,461,001 B1 | 10/2016 | Tsai et al. |
| 9,530,709 B2 | 12/2016 | Leipold et al. |
| 9,613,831 B2 * | 4/2017 | Morris ............... H01L 23/3135 |
| 9,646,856 B2 | 5/2017 | Meyer et al. |
| 9,859,254 B1 | 1/2018 | Yu et al. |
| 9,941,245 B2 | 4/2018 | Skeete et al. |
| 2001/0004131 A1 | 6/2001 | Masayuki et al. |
| 2002/0070443 A1 | 6/2002 | Mu et al. |
| 2002/0074641 A1 | 6/2002 | Towle et al. |
| 2002/0127769 A1 | 9/2002 | Ma et al. |
| 2002/0127780 A1 | 9/2002 | Ma et al. |
| 2002/0137263 A1 | 9/2002 | Towle et al. |
| 2002/0185675 A1 | 12/2002 | Furukawa |
| 2003/0207515 A1 | 11/2003 | Tan et al. |
| 2004/0164367 A1 | 8/2004 | Park |
| 2004/0166642 A1 | 8/2004 | Chen et al. |
| 2004/0219765 A1 | 11/2004 | Reif et al. |
| 2005/0037595 A1 | 2/2005 | Nakahata |
| 2005/0079686 A1 | 4/2005 | Aigner et al. |
| 2005/0212419 A1 | 9/2005 | Vazan et al. |
| 2006/0057782 A1 | 3/2006 | Gardes et al. |
| 2006/0105496 A1 | 5/2006 | Chen et al. |
| 2006/0108585 A1 | 5/2006 | Gan et al. |
| 2006/0261446 A1 | 11/2006 | Wood et al. |
| 2007/0020807 A1 | 1/2007 | Geefay et al. |
| 2007/0069393 A1 | 3/2007 | Asahi et al. |
| 2007/0075317 A1 | 4/2007 | Kato et al. |
| 2007/0121326 A1 | 5/2007 | Nall et al. |
| 2007/0158746 A1 | 7/2007 | Ohguro |
| 2007/0181992 A1 | 8/2007 | Lake |
| 2007/0190747 A1 | 8/2007 | Humpston et al. |
| 2007/0252481 A1 | 11/2007 | Iwamoto et al. |
| 2007/0276092 A1 | 11/2007 | Kanae et al. |
| 2008/0050852 A1 | 2/2008 | Hwang et al. |
| 2008/0050901 A1 | 2/2008 | Kweon et al. |
| 2008/0164528 A1 | 7/2008 | Cohen et al. |
| 2008/0272497 A1 | 11/2008 | Lake |
| 2008/0315372 A1 | 12/2008 | Kuan et al. |
| 2009/0008714 A1 | 1/2009 | Chae |
| 2009/0010056 A1 | 1/2009 | Kuo et al. |
| 2009/0014856 A1 | 1/2009 | Knickerbocker |
| 2009/0179266 A1 | 7/2009 | Abadeer et al. |
| 2009/0261460 A1 | 10/2009 | Kuan et al. |
| 2010/0012354 A1 | 1/2010 | Hedin et al. |
| 2010/0029045 A1 | 2/2010 | Ramanathan et al. |
| 2010/0045145 A1 | 2/2010 | Tsuda |
| 2010/0081232 A1 | 4/2010 | Furman et al. |
| 2010/0081237 A1 | 4/2010 | Wong et al. |
| 2010/0109122 A1 | 5/2010 | Ding et al. |
| 2010/0127340 A1 * | 5/2010 | Sugizaki ............... B81B 7/007 |
| | | 257/415 |

(56) References Cited

U.S. PATENT DOCUMENTS

| | | |
|---|---|---|
| 2010/0173436 A1 | 7/2010 | Ouellet et al. |
| 2010/0200919 A1 | 8/2010 | Kikuchi |
| 2011/0003433 A1 | 1/2011 | Harayama et al. |
| 2011/0026232 A1 | 2/2011 | Lin et al. |
| 2011/0036400 A1 | 2/2011 | Murphy et al. |
| 2011/0062549 A1 | 3/2011 | Lin |
| 2011/0068433 A1 | 3/2011 | Kim et al. |
| 2011/0102002 A1 | 5/2011 | Riehl et al. |
| 2011/0171792 A1 | 7/2011 | Chang et al. |
| 2011/0272800 A1 | 11/2011 | Chino |
| 2011/0272824 A1 | 11/2011 | Pagaila |
| 2011/0294244 A1 | 12/2011 | Hattori et al. |
| 2012/0003813 A1 | 1/2012 | Chuang et al. |
| 2012/0068276 A1 | 3/2012 | Lin et al. |
| 2012/0094418 A1 | 4/2012 | Grama et al. |
| 2012/0098074 A1 | 4/2012 | Lin et al. |
| 2012/0104495 A1 | 5/2012 | Zhu et al. |
| 2012/0119346 A1 | 5/2012 | Im et al. |
| 2012/0153393 A1 | 6/2012 | Liang et al. |
| 2012/0168863 A1 | 7/2012 | Zhu et al. |
| 2012/0256260 A1 | 10/2012 | Cheng et al. |
| 2012/0292700 A1 | 11/2012 | Khakifirooz et al. |
| 2012/0299105 A1 | 11/2012 | Cai et al. |
| 2013/0001665 A1 | 1/2013 | Zhu et al. |
| 2013/0015429 A1 | 1/2013 | Hong et al. |
| 2013/0049205 A1 | 2/2013 | Meyer et al. |
| 2013/0099315 A1 | 4/2013 | Zhu et al. |
| 2013/0105966 A1 | 5/2013 | Kelkar et al. |
| 2013/0147009 A1 | 6/2013 | Kim |
| 2013/0155681 A1 | 6/2013 | Nall et al. |
| 2013/0196483 A1 | 8/2013 | Dennard et al. |
| 2013/0200456 A1 | 8/2013 | Zhu et al. |
| 2013/0280826 A1 | 10/2013 | Scanlan et al. |
| 2013/0299871 A1 | 11/2013 | Mauder et al. |
| 2014/0035129 A1 | 2/2014 | Stuber et al. |
| 2014/0134803 A1 | 5/2014 | Kelly et al. |
| 2014/0168014 A1 | 6/2014 | Chih et al. |
| 2014/0197530 A1 | 7/2014 | Meyer et al. |
| 2014/0210314 A1 | 7/2014 | Bhattacharjee et al. |
| 2014/0252566 A1 | 9/2014 | Kerr et al. |
| 2014/0252567 A1 | 9/2014 | Carroll et al. |
| 2014/0264813 A1 | 9/2014 | Lin et al. |
| 2014/0264818 A1 | 9/2014 | Lowe, Jr. et al. |
| 2014/0306324 A1 | 10/2014 | Costa et al. |
| 2014/0327003 A1 | 11/2014 | Fuergut et al. |
| 2014/0327150 A1 | 11/2014 | Jung et al. |
| 2014/0346573 A1 | 11/2014 | Adam et al. |
| 2015/0115416 A1 | 4/2015 | Costa et al. |
| 2015/0130045 A1 | 5/2015 | Tseng et al. |
| 2015/0235990 A1 | 8/2015 | Cheng et al. |
| 2015/0235993 A1 | 8/2015 | Cheng et al. |
| 2015/0243881 A1 | 8/2015 | Sankman et al. |
| 2015/0255368 A1 | 9/2015 | Costa |
| 2015/0262844 A1* | 9/2015 | Meyer ............... H01L 23/3107 257/737 |
| 2015/0279789 A1 | 10/2015 | Mahajan et al. |
| 2015/0311132 A1 | 10/2015 | Kuo et al. |
| 2015/0364344 A1 | 12/2015 | Yu et al. |
| 2015/0380523 A1 | 12/2015 | Hekmatshoartabari et al. |
| 2016/0002510 A1 | 1/2016 | Champagne et al. |
| 2016/0079137 A1 | 3/2016 | Leipold et al. |
| 2016/0093580 A1 | 3/2016 | Scanlan et al. |
| 2016/0100489 A1* | 4/2016 | Costa ............... H01F 27/24 361/764 |
| 2016/0126111 A1 | 5/2016 | Leipold et al. |
| 2016/0126196 A1 | 5/2016 | Leipold et al. |
| 2016/0155706 A1 | 6/2016 | Yoneyama et al. |
| 2016/0284568 A1 | 9/2016 | Morris et al. |
| 2016/0284570 A1 | 9/2016 | Morris et al. |
| 2016/0343592 A1 | 11/2016 | Costa et al. |
| 2016/0343604 A1 | 11/2016 | Costa et al. |
| 2016/0362292 A1 | 12/2016 | Chang et al. |
| 2017/0032957 A1 | 2/2017 | Costa et al. |
| 2017/0077028 A1 | 3/2017 | Maxim et al. |
| 2017/0098587 A1 | 4/2017 | Leipold et al. |
| 2017/0190572 A1 | 7/2017 | Pan et al. |
| 2017/0271200 A1 | 9/2017 | Costa |
| 2017/0323804 A1 | 11/2017 | Costa et al. |
| 2017/0323860 A1 | 11/2017 | Costa et al. |
| 2017/0334710 A1 | 11/2017 | Costa et al. |
| 2017/0358511 A1 | 12/2017 | Costa et al. |
| 2018/0019184 A1 | 1/2018 | Costa et al. |
| 2018/0019185 A1 | 1/2018 | Costa et al. |

FOREIGN PATENT DOCUMENTS

| | | |
|---|---|---|
| JP | 2006005025 A | 1/2006 |
| JP | 2007227439 A | 9/2007 |
| JP | 2008235490 A | 10/2008 |
| JP | 2008279567 A | 11/2008 |
| JP | 2009026880 A | 2/2009 |
| JP | 2009530823 A | 8/2009 |
| WO | 2007074651 A1 | 7/2007 |

OTHER PUBLICATIONS

U.S. Appl. No. 14/529,870, filed Oct. 31, 2014; now U.S. Pat. No. 9,583,414.
U.S. Appl. No. 15/293,947, filed Oct. 14, 2016.
U.S. Appl. No. 14/715,830, filed May 19, 2015.
U.S. Appl. No. 14/851,652, filed Sep. 11, 2015.
U.S. Appl. No. 14/872,910, filed Oct. 1, 2015.
U.S. Appl. No. 14/885,202, filed Oct. 16, 2015.
U.S. Appl. No. 14/885,243, filed Oct. 16, 2015; now U.S. Pat. No. 9,530,709.
U.S. Appl. No. 15/387,855, filed Dec. 22, 2016.
U.S. Appl. No. 14/959,129, filed Dec. 4, 2015, now U.S. Pat. No. 9,613,831.
U.S. Appl. No. 15/173,037, filed Jun. 3, 2016.
U.S. Appl. No. 15/648,082, filed Jul. 12, 2017.
U.S. Appl. No. 15/229,780, filed Aug. 5, 2016.
U.S. Appl. No. 15/262,457, filed Sep. 12, 2016.
U.S. Appl. No. 15/408,560, filed Jan. 18, 2017.
U.S. Appl. No. 15/287,202, filed Oct. 6, 2016.
U.S. Appl. No. 15/601,858, filed May 22, 2017.
U.S. Appl. No. 15/353,346, filed Nov. 16, 2016.
U.S. Appl. No. 15/652,826, filed Jul. 18, 2017.
U.S. Appl. No. 15/287,273, filed Oct. 6, 2016.
U.S. Appl. No. 15/676,621, filed Aug. 14, 2017.
U.S. Appl. No. 15/676,693, filed Aug. 14, 2017.
U.S. Appl. No. 15/498,040, filed Apr. 26, 2017.
U.S. Appl. No. 15/652,867, filed Jul. 18, 2017.
U.S. Appl. No. 15/789,107, filed Oct. 20, 2017.
U.S. Appl. No. 15/491,064, filed Apr. 19, 2017.
U.S. Appl. No. 15/695,579, filed Sep. 5, 2017.
U.S. Appl. No. 15/695,629, filed Sep. 5, 2017.
Notice of Allowance for U.S. Appl. No. 15/287,273, dated Jun. 30, 2017, 8 pages.
Corrected Notice of Allowability for U.S. Appl. No. 15/287,273, dated Jul. 21, 2017, 5 pages.
Supplemental Notice of Allowability for U.S. Appl. No. 15/287,273, dated Sep. 7, 2017, 5 pages.
Extended European Search Report for European Patent Application No. 15184861.1, dated Jan. 25, 2016, 6 pages.
Office Action of the Intellectual Property Office for Taiwanese Patent Application No. 104130224, dated Jun. 15, 2016, 9 pages.
Non-Final Office Action for U.S. Appl. No. 14/885,202, dated Apr. 14, 2016, 5 pages.
Final Office Action for U.S. Appl. No. 14/885,202, dated Sep. 27, 2016, 7 pages.
Advisory Action for U.S. Appl. No. 14/885,202, dated Nov. 29, 2016, 3 pages.
Notice of Allowance for U.S. Appl. No. 14/885,202, dated Jan. 27, 2017, 7 pages.
Notice of Allowance for U.S. Appl. No. 14/885,202, dated Jul. 24, 2017, 8 pages.
Notice of Allowance for U.S. Appl. No. 14/885,243, dated Aug. 31, 2016, 8 pages.

(56) References Cited

OTHER PUBLICATIONS

Non-Final Office Action for U.S. Appl. No. 12/906,689, dated May 27, 2011, 13 pages.
Non-Final Office Action for U.S. Appl. No. 12/906,689, dated Nov. 4, 2011, 20 pages.
Search Report for Japanese Patent Application No. 2011-229152, created on Feb. 22, 2013, 58 pages.
Office Action for Japanese Patent Application No. 2011-229152, drafted May 10, 2013, 7 pages.
Final Rejection for Japanese Patent Application No. 2011-229152, drafted Oct. 25, 2013, 2 pages.
International Search Report and Written Opinion for PCT/US2016/045809, dated Oct. 7, 2016, 11 pages.
Non-Final Office Action for U.S. Appl. No. 15/652,867, dated Oct. 10, 2017, 5 pages.
Bernheim et al., "Chapter 9: Lamination," Tools and Manufacturing Engineers Handbook (book), Apr. 1, 1996, Society of Manufacturing Engineers, p. 9-1.
Fillion R. et al., "Development of a Plastic Encapsulated Multichip Technology for High Volume, Low Cost Commercial Electronics," Electronic Components and Technology Conference, vol. 1, May 1994, IEEE, 5 pages.
Henawy, Mahmoud Al et al., "New Thermoplastic Polymer Substrate for Microstrip Antennas at 60 GHz," German Microwave Conference, Mar. 15-17, 2010, Berlin, Germany, IEEE, pp. 5-8.
International Search Report and Written Opinion for PCT/US2017/046744, dated Nov. 27, 2017, 17 pages.
International Search Report and Written Opinion for PCT/US2017/046758, dated Nov. 16, 2017, 19 pages.
International Search Report and Written Opinion for PCT/US2017/046779, dated Nov. 29, 2017, 17 pages.
Non-Final Office Action for U.S. Appl. No. 15/616,109, dated Oct. 23, 2017, 16 pages.
Corrected Notice of Allowability for U.S. Appl. No. 14/851,652, dated Oct. 20, 2017, 5 pages.
Final Office Action for U.S. Appl. No. 15/262,457, dated Dec. 19, 2017, 12 pages.
Supplemental Notice of Allowability and Applicant-Initiated Interview Summary for U.S. Appl. No. 15/287,273, dated Oct. 18, 2017, 6 pages.
Supplemental Notice of Allowability for U.S. Appl. No. 15/287,273, dated Nov. 2, 2017, 5 pages.
Non-Final Office Action for U.S. Appl. No. 15/491,064, dated Jan. 2, 2018, 9 pages.
Notice of Allowance for U.S. Appl. No. 14/872,910, dated Nov. 17, 2017, 11 pages.
Notice of Allowance for U.S. Appl. No. 15/648,082, dated Nov. 29, 2017, 8 pages.
Non-Final Office Action for U.S. Appl. No. 15/652,826, dated Nov. 3, 2017, 5 pages.
Notice of Allowance for U.S. Appl. No. 15/229,780, dated Oct. 3, 2017, 7 pages.
Ali, K. Ben et al., "RF SOI CMOS Technology on Commercial Trap-Rich High Resistivity SOI Wafer," 2012 IEEE International SOI Conference (SOI), Oct. 1-4, 2012, Napa, California, IEEE, 2 pages.
Anderson, D.R., "Thermal Conductivity of Polymers," Sandia Corporation, Mar. 8, 1966, pp. 677-690.
Author Unknown, "96% Alumina, thick-film, as fired," MatWeb, Date Unknown, date accessed Apr. 6, 2016, 2 pages, http://www.matweb.com/search/DataSheet.aspx?MatGUID=3996a734395a4870a9739076918c4297&ckck=1.
Author Unknown, "CoolPoly D5108 Thermally Conductive Polyphenylene Sulfide (PPS)," Cool Polymers, Inc., Aug. 8, 2007, 2 pages.
Author Unknown, "CoolPoly D5506 Thermally Conductive Liquid Crystalline Polymer (LCP)," Cool Polymers, Inc., Dec. 12, 2013, 2 pages.
Author Unknown, "CoolPoly D-Series—Thermally Conductive Dielectric Plastics," Cool Polymers, Retrieved Jun. 24, 2013, http://coolpolymers.com/dseries.asp, 1 page.
Author Unknown, "CoolPoly E2 Thermally Conductive Liquid Crystalline Polymer (LCP)," Cool Polymers, Inc., Aug. 8, 2007, http://www.coolpolymers.com/Files/DS/Datasheet_e2.pdf, 1 page.
Author Unknown, "CoolPoly E3605 Thermally Conductive Polyamide 4,6 (PA 4,6)," Cool Polymers, Inc., Aug. 4, 2007, 1 page, http://www.coolpolymers.com/Files/DS/Datasheet_e3605.pdf.
Author Unknown, "CoolPoly E5101 Thermally Conductive Polyphenylene Sulfide (PPS)," Cool Polymers, Inc., Aug. 27, 2007, 1 page, http://www.coolpolymers.com/Files/DS/Datasheet_e5101.pdf.
Author Unknown, "CoolPoly E5107 Thermally Conductive Polyphenylene Sulfide (PPS)," Cool Polymers, Inc., Aug. 8, 2007, 1 page, http://coolpolymers.com/Files/DS/Datasheet_e5107.pdf.
Author Unknown, "CoolPoly Selection Tool," Cool Polymers, Inc., 2006, 1 page, http://www.coolpolymers.com/select.asp?Application=Substrates+%26+Electcronic_Packaging.
Author Unknown, "CoolPoly Thermally Conductive Plastics for Dielectric Heat Plates," Cool Polymers, Inc., 2006, 2 pages, http://www.coolpolymers.com/heatplate.asp.
Author Unknown, "CoolPoly Thermally Conductive Plastics for Substrates and Electronic Packaging," Cool Polymers, Inc., 2005, 1 page.
Author Unknown, "Electrical Properties of Plastic Materials," Professional Plastics, Oct. 28, 2011, http://www.professionalplastics.com/professionalplastics/ElectricalPropertiesofPlastics.pdf, accessed Dec. 18, 2014, 4 pages.
Author Unknown, "Fully Sintered Ferrite Powders," Powder Processing and Technology, LLC, Date Unknown, 1 page.
Author Unknown, "Heat Transfer," Cool Polymers, Inc., 2006, http://www.coolpolymers.com/heattrans.html, 2 pages.
Author Unknown, "Hysol UF3808," Henkel Corporation, Technical Data Sheet, May 2013, 2 pages.
Author Unknown, "PolyOne Therma-Tech™ LC-5000C TC LCP," MatWeb, Date Unknown, date accessed Apr. 6, 2016, 2 pages, http://www.matweb.com/search/datasheettext.aspx?matguid=89754e8bb26148d083c5ebb05a0cbff1.
Author Unknown, "Sapphire Substrate," from CRC Handbook of Chemistry and Physics, Date Unknown, 1 page.
Author Unknown, "Thermal Properties of Plastic Materials," Professional Plastics, Aug. 21, 2010, http://www.professionalplastics.com/professionalplastics/ThermalPropertiesofPlasticMaterials.pdf, accessed Dec. 18, 2014, 4 pages.
Author Unknown, "Thermal Properties of Solids," PowerPoint Presentation, No Date, 28 slides, http://www.phys.huji.ac.il/Phys_Hug/Lectures/77602/PHONONS_2_thermal.pdf.
Author Unknown, "Thermal Resistance & Thermal Conductance," C-Therm Technologies Ltd., accessed Sep. 19, 2013, 4 pages, http://www.ctherm.com/products/tci_thermal_conductivity/helpful_links_tools/thermal_resistance_thermal_conductance/.
Author Unknown, "The Technology: AKHAN's Approach and Solution: The Miraj Diamond™ Platform," 2015, accessed Oct. 9, 2016, http://www.akhansemi.com/technology.html#the-miraj-diamond-platform, 5 pages.
Beck, D., et al., "CMOS on FZ-High Resistivity Substrate for Monolithic Integration of SiGe-RF-Circuitry and Readout Electronics," IEEE Transactions on Electron Devices, vol. 44, No. 7, Jul. 1997, pp. 1091-1101.
Botula, A., et al., "A Thin-Film SOI 180nm CMOS RF Switch Technology," IEEE Topical Meeting on Silicon Monolithic Integrated Circuits in RF Systems, (SiRF '09), Jan. 2009, pp. 1-4.
Carroll, M., et al., "High-Resistivity SOI CMOS Cellular Antenna Switches," Annual IEEE Compound Semiconductor Integrated Circuit Symposium, (CISC 2009), Oct. 2009, pp. 1-4.
Colinge, J.P., et al., "A Low-Voltage, Low-Power Microwave SOI MOSFET," Proceedings of 1996 IEEE International SOI Conference, Oct. 1996, pp. 128-129.
Costa, J. et al., "Integrated MEMS Switch Technology on SOI-CMOS," Proceedings of Hilton Head Workshop: A Solid-State Sensors, Actuators and Microsystems Workshop, Jun. 1-5, 2008, Hilton Head Island, SC, IEEE, pp. 900-903.

(56) References Cited

OTHER PUBLICATIONS

Costa, J. et al., "Silicon RFCMOS SOI Technology with Above-IC MEMS Integration for Front End Wireless Applications," Bipolar/BiCMOS Circuits and Technology Meeting, 2008, BCTM 2008, IEEE, pp. 204-207.
Costa, J., "RFCMOS SOI Technology for 4G Reconfigurable RF Solutions," Session WEC1-2, Proceedings of the 2013 IEEE International Microwave Symposium, 4 pages.
Esfeh, Babak Kazemi et al., "RF Non-Linearities from Si-Based Substrates," 2014 International Workshop on Integrated Nonlinear Microwave and Millimetre-wave Circuits (INMMiC), Apr. 2-4, 2014, IEEE, 3 pages.
Finne, R. M. et al., "A Water-Amine-Complexing Agent System for Etching Silicon," Journal of the Electrochemical Society, vol. 114, No. 9, Sep. 1967, pp. 965-970.
Gamble, H. S. et al., "Low-Loss CPW Lines on Surface Stabilized High-Resistivity Silicon," IEEE Microwave and Guided Wave Letters, vol. 9, No. 10, Oct. 1999, pp. 395-397.
Huang, Xingyi, et al., "A Review of Dielectric Polymer Composites with High Thermal Conductivity," IEEE Electrical Insulation Magazine, vol. 27, No. 4, Jul./Aug. 2011, pp. 8-16.
Joshi, V. et al., "MEMS Solutions in RF Applications," 2013 IEEE SOI-3D-Subthreshold Microelectronics Technology Unified Conference (S3S), Oct. 2013, IEEE, 2 pages.
Jung, Boo Yang, et al., "Study of FCMBGA with Low CTE Core Substrate," 2009 Electronic Components and Technology Conference, May 2009, pp. 301-304.
Kerr, D.C., et al., "Identification of RF Harmonic Distortion on Si Substrates and Its Reduction Using a Trap-Rich Layer," IEEE Topical Meeting on Silicon Monolithic Integrated Circuits in RF Systems, (SiRF 2008), Jan. 2008, pp. 151-154.
Lederer, D., et al., "New Substrate Passivation Method Dedicated to HR SOI Wafer Fabrication with Increased Substrate Resistivity," IEEE Electron Device Letters, vol. 26, No. 11, Nov. 2005, pp. 805-807.
Lederer, Dimitri et al., "Substrate loss mechanisms for microstrip and CPW transmission lines on lossy silicon wafers," Solid-State Electronics, vol. 47, No. 11, Nov. 2003, pp. 1927-1936.
Lee, Kwang Hong et al., "Integration of III-V materials and Si-CMOS through double layer transfer process," Japanese Journal of Applied Physics, vol. 54, Jan. 2015, pp. 030209-1 to 030209-5.
Lee, Tzung-Yin, et al., "Modeling of SOI FET for RF Switch Applications," IEEE Radio Frequency Integrated Circuits Symposium, May 23-25, 2010, Anaheim, CA, IEEE, pp. 479-482.
Lu, J.Q., et al., "Evaluation Procedures for Wafer Bonding and Thinning of Interconnect Test Structures for 3D ICs," Proceedings of the IEEE 2003 International Interconnect Technology Conference, Jun. 2-4, 2003, pp. 74-76.
Mamunya, Ye.P., et al., "Electrical and Thermal Conductivity of Polymers Filled with Metal Powders," European Polymer Journal, vol. 38, 2002, pp. 1887-1897.
Mansour, Raafat R., "RF MEMS-CMOS Device Integration," IEEE Microwave Magazine, vol. 14, No. 1, Jan. 2013, pp. 39-56.
Mazuré, C. et al., "Advanced SOI Substrate Manufacturing," 2004 IEEE International Conference on Integrated Circuit Design and Technology, 2004, IEEE, pp. 105-111.
Micak, R. et al., "Photo-Assisted Electrochemical Machining of Micromechanical Structures," Proceedings of Micro Electro Mechanical Systems, Feb. 7-10, 1993, Fort Lauderdale, FL, IEEE, pp. 225-229.
Morris, Art, "Monolithic Integration of RF-MEMS within CMOS," 2015 International Symposium on VLSI Technology, Systems and Application (VLSI-TSA), Apr. 27-29, 2015, IEEE, 2 pages.
Niklaus, F., et al., "Adhesive Wafer Bonding," Journal of Applied Physics, vol. 99, No. 3, 031101 (2006), 28 pages.
Parthasarathy, S., et al., "RF SOI Switch FET Design and Modeling Tradeoffs for GSM Applications," 2010 23rd International Conference on VLSI Design, (VLSID '10), Jan. 2010, pp. 194-199.

Raskin, J.P., et al., "Coupling Effects in High-Resistivity SIMOX Substrates for VHF and Microwave Applications," Proceedings of 1995 IEEE International SOI Conference, Oct. 1995, pp. 62-63.
Raskin, Jean-Pierre et al., "Substrate Crosstalk Reduction Using SOI Technology," IEEE Transactions on Electron Devices, vol. 44, No. 12, Dec. 1997, pp. 2252-2261.
Rong, B., et al., "Surface-Passivated High-Resistivity Silicon Substrates for RFICs," IEEE Electron Device Letters, vol. 25, No. 4, Apr. 2004, pp. 176-178.
Sherman, Lilli M., "Plastics that Conduct Heat," Plastics Technology Online, Jun. 2001, Retrieved May 17, 2016, http://www.ptonline.com/articles/plastics-that-conduct-heat, Gardner Business Media, Inc., 5 pages.
Tombak, A., et al., "High-Efficiency Cellular Power Amplifiers Based on a Modified LDMOS Process on Bulk Silicon and Silicon-on-Insulator Substrates with Integrated Power Management Circuitry," IEEE Transactions on Microwave Theory and Techniques, vol. 60, No. 6, Jun. 2012, pp. 1862-1869.
Yamanaka, A., et al., "Thermal Conductivity of High-Strength Polyetheylene Fiber and Applications for Cryogenic Use," International Scholarly Research Network, ISRN Materials Science, vol. 2011, Article ID 718761, May 25, 2011, 10 pages.
Non-Final Office Action for U.S. Appl. No. 13/852,648, dated Jul. 18, 2013, 20 pages.
Final Office Action for U.S. Appl. No. 13/852,648, dated Nov. 26, 2013, 21 pages.
Applicant-Initiated Interview Summary for U.S. Appl. No. 13/852,648, dated Jan. 27, 2014, 4 pages.
Advisory Action for U.S. Appl. No. 13/852,648, dated Mar. 7, 2014, 4 pages.
Notice of Allowance for U.S. Appl. No. 13/852,648, dated Jun. 16, 2014, 9 pages.
Notice of Allowance for U.S. Appl. No. 13/852,648, dated Sep. 26, 2014, 8 pages.
Notice of Allowance for U.S. Appl. No. 13/852,648, dated Jan. 22, 2015, 8 pages.
Non-Final Office Action for U.S. Appl. No. 13/852,648, dated Jun. 24, 2015, 20 pages.
Final Office Action for U.S. Appl. No. 13/852,648, dated Oct. 22, 2015, 20 pages.
Non-Final Office Action for U.S. Appl. No. 13/852,648, dated Feb. 19, 2016, 12 pages.
Final Office Action for U.S. Appl. No. 13/852,648, dated Jul. 20, 2016, 14 pages.
Non-Final Office Action for U.S. Appl. No. 14/315,765, dated Jan. 2, 2015, 6 pages.
Final Office Action for U.S. Appl. No. 14/315,765, dated May 11, 2015, 17 pages.
Advisory Action for U.S. Appl. No. 14/315,765, dated Jul. 22, 2015, 3 pages.
Non-Final Office Action for U.S. Appl. No. 14/260,909, dated Mar. 20, 2015, 20 pages.
Final Office Action for U.S. Appl. No. 14/260,909, dated Aug. 12, 2015, 18 pages.
Non-Final Office Action for U.S. Appl. No. 14/261,029, dated Dec. 5, 2014, 15 pages.
Notice of Allowance for U.S. Appl. No. 14/261,029, dated Apr. 27, 2015, 10 pages.
Corrected Notice of Allowability for U.S. Appl. No. 14/261,029, dated Nov. 17, 2015, 5 pages.
Non-Final Office Action for U.S. Appl. No. 14/529,870, dated Feb. 12, 2016, 14 pages.
Notice of Allowance for U.S. Appl. No. 14/529,870, dated Jul. 15, 2016, 8 pages.
Non-Final Office Action for U.S. Appl. No. 15/293,947, dated Apr. 7, 2017, 12 pages.
Notice of Allowance for U.S. Appl. No. 15/293,947, dated Aug. 14, 2017, 7 pages.
Non-Final Office Action for U.S. Appl. No. 14/715,830, dated Apr. 13, 2016, 16 pages.
Final Office Action for U.S. Appl. No. 14/715,830, dated Sep. 6, 2016, 13 pages.

(56) References Cited

OTHER PUBLICATIONS

Advisory Action for U.S. Appl. No. 14/715,830, dated Oct. 31, 2016, 6 pages.
Notice of Allowance for U.S. Appl. No. 14/715,830, dated Feb. 10, 2017, 8 pages.
Notice of Allowance for U.S. Appl. No. 14/715,830, dated Mar. 2, 2017, 8 pages.
Non-Final Office Action for U.S. Appl. No. 14/851,652, dated Oct. 7, 2016, 10 pages.
Notice of Allowance for U.S. Appl. No. 14/851,652, dated Apr. 11, 2017, 9 pages.
Corrected Notice of Allowance for U.S. Appl. No. 14/851,652, dated Jul. 24, 2017, 6 pages.
Corrected Notice of Allowance for U.S. Appl. No. 14/851,652, dated Sep. 6, 2017, 5 pages.
Notice of Allowance for U.S. Appl. No. 14/959,129, dated Oct. 11, 2016, 8 pages.
Non-Final Office Action for U.S. Appl. No. 15/173,037, dated Jan. 10, 2017, 8 pages.
Final Office Action for U.S. Appl. No. 15/173,037, dated May 2, 2017, 13 pages.
Advisory Action for U.S. Appl. No. 15/173,037, dated Jul. 20, 2017, 3 pages.
Notice of Allowance for U.S. Appl. No. 15/173,037, dated Aug. 9, 2017, 7 pages.
Non-Final Office Action for U.S. Appl. No. 15/085,185, dated Feb. 15, 2017, 10 pages.
Non-Final Office Action for U.S. Appl. No. 15/085,185, dated Jun. 6, 2017, 5 pages.
Non-Final Office Action for U.S. Appl. No. 15/229,780, dated Jun. 30, 2017, 12 pages.
Non-Final Office Action for U.S. Appl. No. 15/262,457, dated Aug. 7, 2017, 10 pages.
Notice of Allowance for U.S. Appl. No. 15/408,560, dated Sep. 25, 2017, 8 pages.
Notice of Allowance for U.S. Appl. No. 15/287,202, dated Aug. 25, 2017, 11 pages.
Non-Final Office Action for U.S. Appl. No. 15/353,346, dated May 23, 2017, 15 pages.
Notice of Allowance for U.S. Appl. No. 15/353,346, dated Sep. 25, 2017, 9 pages.
Non-Final Office Action for U.S. Appl. No. 15/795,915, dated Feb. 23, 2018, 6 pages.
Non-Final Office Action for U.S. Appl. No. 15/387,855, dated Jan. 16, 2018, 7 pages.
Advisory Action and Applicant-Initiated Interview Summary for U.S. Appl. No. 15/262,457, dated Feb. 28, 2018, 5 pages.
Supplemental Notice of Allowability for U.S. Appl. No. 15/287,273, dated Jan. 17, 2018, 5 pages.
Supplemental Notice of Allowability for U.S. Appl. No. 15/287,273, dated Feb. 23, 2018, 5 pages.
Notice of Allowance for U.S. Appl. No. 15/498,040, dated Feb. 20, 2018, 8 pages.
Non-Final Office Action for U.S. Appl. No. 15/676,621, dated Mar. 26, 2018, 16 pages.
International Preliminary Report on Patentability for PCT/US2016/045809, dated Feb. 22, 2018, 8 pages.
Final Office Action for U.S. Appl. No. 15/616,109, dated Apr. 19, 2018, 18 pages.
Notice of Allowance for U.S. Appl. No. 15/795,915, dated Jun. 15, 2018, 7 pages.
Non-Final Office Action for U.S. Appl. No. 15/262,457, dated Apr. 19, 2018, 10 pages.
Notice of Allowance for U.S. Appl. No. 15/491,064, dated Apr. 30, 2018, 9 pages.
Non-Final Office Action for U.S. Appl. No. 15/601,858, dated Jun. 26, 2018, 12 pages.
Notice of Allowance for U.S. Appl. No. 15/616,109, dated Jul. 2, 2018, 7 pages.
Notice of Allowance for U.S. Appl. No. 15/676,621, dated Jun. 5, 2018, 8 pages.
Non-Final Office Action for U.S. Appl. No. 15/676,693, dated May 3, 2018, 14 pages.
Final Office Action for U.S. Appl. No. 15/387,855, dated May 24, 2018, 9 pages.
Notice of Allowance for U.S. Appl. No. 15/695,629, dated Jul. 11, 2018, 12 pages.
Notice of Allowance for U.S. Appl. No. 15/789,107, dated May 18, 2018, 8 pages.
Notice of Allowance for U.S. Appl. No. 15/387,855, dated Aug. 10, 2018, 7 pages.
Notice of Allowance and Applicant-Initiated Interview Summary for U.S. Appl. No. 15/262,457, dated Sep. 28, 2018, 16 pages.
Notice of Allowance for U.S. Appl. No. 15/676,693, dated Jul. 20, 2018, 8 pages.
Corrected Notice of Allowance for U.S. Appl. No. 15/676,693, dated Aug. 29, 2018, 5 pages.
Notice of Allowance for U.S. Appl. No. 15/914,538, dated Aug. 1, 2018, 9 pages.
Final Office Action for U.S. Appl. No. 15/601,858, dated Nov. 26, 2018, 16 pages.
Non-Final Office Action for U.S. Appl. No. 15/945,418, dated Nov. 1, 2018, 13 pages.

* cited by examiner

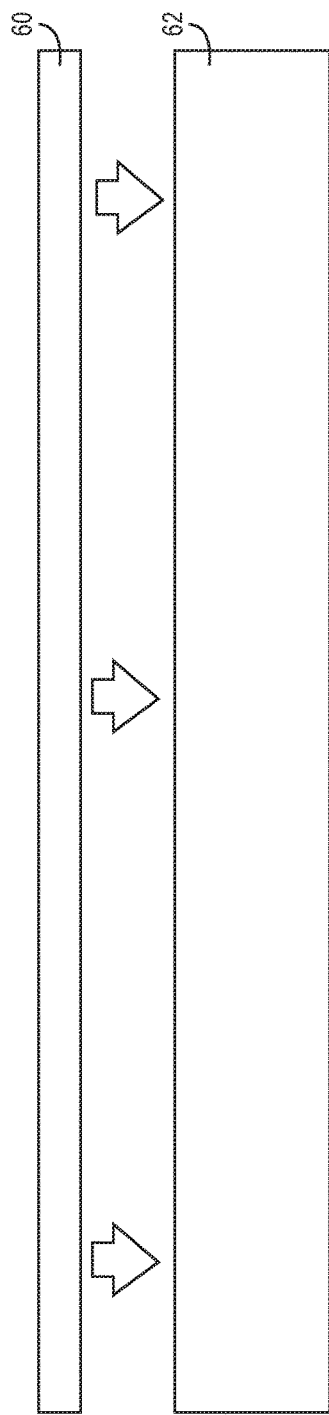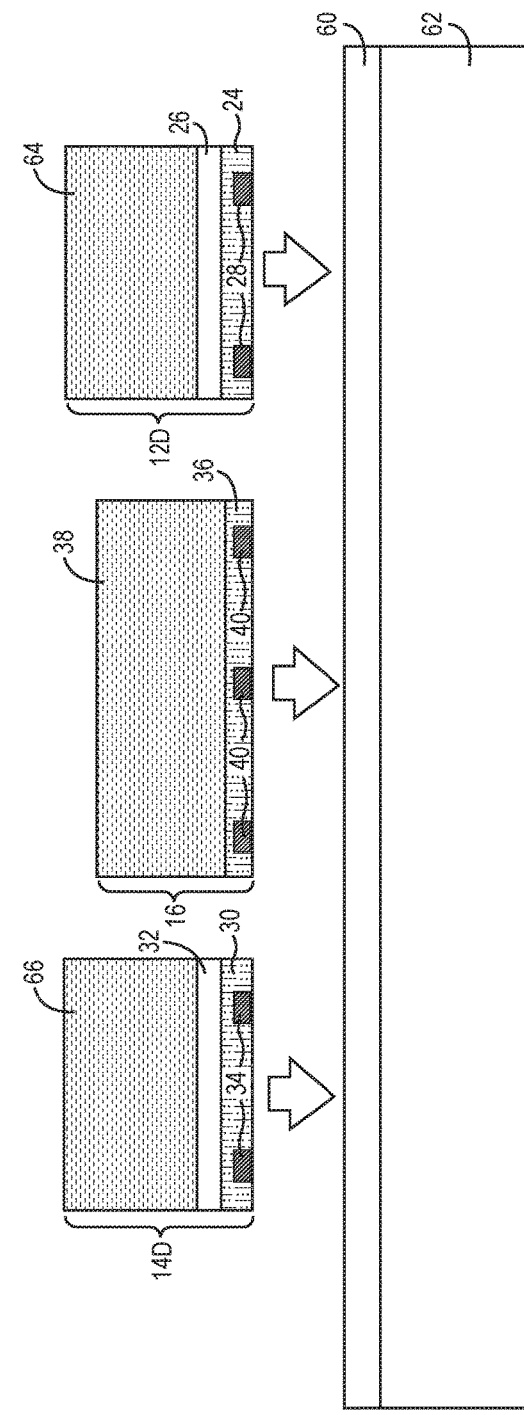

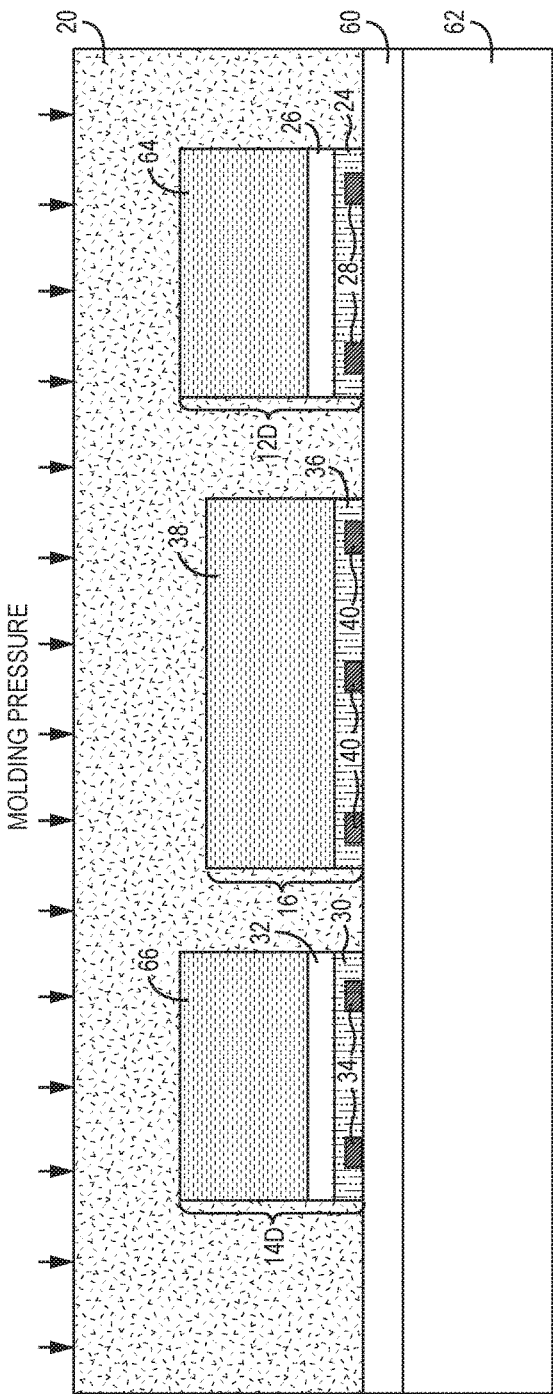
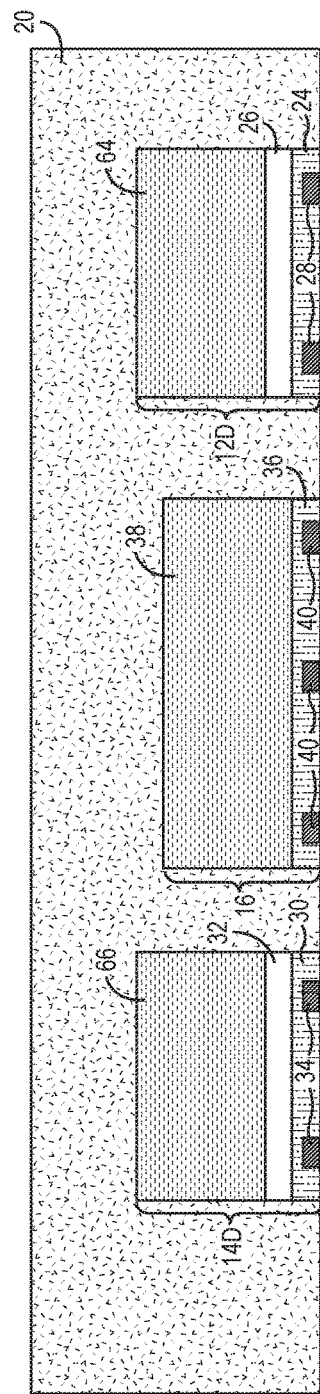
FIG. 6
FIG. 7

WAFER-LEVEL PACKAGE WITH ENHANCED PERFORMANCE

RELATED APPLICATIONS

This application claims the benefit of provisional patent application Ser. No. 62/374,304 filed Aug. 12, 2016, the disclosure of which is hereby incorporated herein by reference in its entirety.

FIELD OF THE DISCLOSURE

The present disclosure relates to a wafer-level package and a process for making the same, and more particularly to a wafer-level package with enhanced thermal, electrical, and rigidity performance, and a packaging process to enhance thermal, electrical and rigidity performance of a wafer-level package.

BACKGROUND

The wide utilization of cellular and wireless devices drives the rapid development of radio frequency (RF) technologies. The substrates on which RF devices are fabricated play an important role in achieving high level performance in the RF technologies. Fabrications of the RF devices on conventional silicon substrates may benefit from low cost of silicon materials, a large scale capacity of wafer production, well-established semiconductor design tools, and well-established semiconductor manufacturing techniques.

Despite the benefits of using conventional silicon substrates for the RF device fabrications, it is well known in the industry that the conventional silicon substrates may have two undesirable properties for the RF devices: harmonic distortion and low resistivity values. The harmonic distortion is a critical impediment to achieve high level linearity in the RF devices built over silicon substrates. In addition, the low resistivity encountered in the silicon substrates may degrade quality factors (Q) at high frequencies of microelectromechanical systems (MEMS) or other passive components.

Further, high speed and high performance transistors are more densely integrated in RF devices. Consequently, the amount of heat generated by the RF devices will increase significantly due to the large number of transistors integrated in the RF devices, the large amount of power passing through the transistors, and the high operation speed of the transistors. Accordingly, it is desirable to package the RF devices in a configuration for better heat dissipation.

Wafer-level fan-out (WLFO) packaging technology and embedded wafer-level ball grid array (EWLB) technology currently attract substantial attention in portable RF applications. WLFO and EWLB technologies are designed to provide high density input/output ports (I/O) without increasing the size of a package. This capability allows for densely packaging the RF devices within a single wafer.

To accommodate the increased heat generation of the RF devices, to reduce deleterious harmonic distortion of the RF devices, and to utilize advantages of WLFO/EWLB packaging technologies, it is therefore an object of the present disclosure to provide an improved package design with enhanced performance. Further, there is also a need to enhance the performance of the RF devices without increasing the package size.

SUMMARY

The present disclosure relates to a wafer-level package with enhanced thermal, electrical, and rigidity performance, and a process for making the same. The disclosed wafer-level package includes a first thinned die, a multilayer redistribution structure, a first mold compound, and a second mold compound. The first thinned die includes a first device layer and a first dielectric layer over the first device layer. The first device layer includes a number of first die contacts at a bottom surface of the first device layer. The multilayer redistribution structure includes at least one first support pad, a number of package contacts, and redistribution interconnects. Herein, the first thinned die resides over a top surface of the multilayer redistribution structure. The at least one first support pad is on a bottom surface of the multilayer redistribution structure and vertically aligned with the first thinned die, such that the at least one first support pad is placed vertically below the first thinned die. The package contacts are also on the bottom surface of the multilayer redistribution structure. The redistribution interconnects connect the package contacts to certain ones of the first die contacts. The at least one first support pad is electrically isolated from the package contacts. In addition, the first mold compound resides over the multilayer redistribution structure and around the first thinned die, and extends beyond a top surface of the first thinned die to define an opening within the first mold compound and over the first thinned die. The top surface of the first thinned die is exposed at a bottom of the opening. The second mold compound fills the opening and is in contact with the top surface of the first thinned die.

In one embodiment of the wafer-level package, the at least one first support pad and the package contacts are formed from a common electrically conductive layer.

In one embodiment of the wafer-level package, a bottom surface of the at least one first support pad and a bottom surface of each package contact are in a same flat plane.

In one embodiment of the wafer-level package, the multilayer redistribution structure further comprises at least one second support pad on the bottom surface of the multilayer redistribution structure and not placed vertically below the first thinned die. Herein, the at least one second support pad is electrically isolated from the package contacts.

In one embodiment of the wafer-level package, the at least one first support pad and the at least one second support pad are separate.

In one embodiment of the wafer-level package, the at least one first support pad and the at least one second support pad are connected together.

In one embodiment of the wafer-level package, the first thinned die provides a microelectromechanical systems (MEMS) component.

In one embodiment of the wafer-level package, the first thinned die is formed from a silicon-on-insulator (SOI) structure. The first device layer of the first thinned die is formed from a silicon epitaxy layer of the SOI structure, and the first dielectric layer of the first thinned die is a buried oxide layer of the SOI structure.

According to another embodiment, the wafer-level package further includes a second intact die residing over the multilayer redistribution structure. Herein, the second intact die has a second device layer and an intact silicon substrate over the second device layer, and the first mold compound encapsulates the second intact die.

According to another embodiment, the wafer-level package further includes a third thinned die residing over the multilayer redistribution structure. Herein, the third thinned die has a third device layer and a second dielectric layer over the third device layer. The first mold compound extends beyond a top surface of the third thinned die to define a second opening within the first mold compound and over the third thinned die. The top surface of the third thinned die is exposed at a bottom of the second opening. The second mold compound fills the second opening and in contact with the top surface of the third thinned die.

In one embodiment of the wafer-level package, the multilayer redistribution structure further comprises at least one second support pad and at least one third support pad on the bottom surface of the multilayer redistribution structure. The at least one second support pad and the at least one third support pad are electrically isolated from the package contacts. The at least one second support pad is not placed vertically below the first thinned die and not placed vertically below the third thinned die. The at least one third support pad is vertically aligned with the third thinned die, such that the at least one third support pad is placed vertically below the third thinned die.

In one embodiment of the wafer-level package, the first thinned die provides a MEMS component, the second intact die provides a complementary metal-oxide-semiconductor (CMOS) controller that controls the MEMS component, and the third thinned die is formed from a SOI structure. Herein, the third device layer of the third thinned die is formed from a silicon epitaxy layer of the SOI structure, and the second dielectric layer of the third thinned die is a buried oxide layer of the SOI structure.

In one embodiment of the wafer-level package, the multilayer redistribution structure further includes at least one structure pad. Herein, the at least one structure pad and the redistribution interconnects are formed from a common electrically conductive layer. The at least one structure pad is vertically below the first thinned die, and electrically isolated from the redistribution interconnects.

In one embodiment of the wafer-level package, the second mold compound has a thermal conductivity greater than 2 W/m·K.

In one embodiment of the wafer-level package, the second mold compound has an electrical resistivity greater that 1 E6 Ohm-cm.

In one embodiment of the wafer-level package, the first mold compound is formed from a same material as the second mold compound.

In one embodiment of the wafer-level package, the first mold compound and the second mold compound are formed from different materials.

In one embodiment of the wafer-level package, the multilayer redistribution structure is free of glass fiber.

In one embodiment of the wafer-level package, connections between the redistribution interconnects and the plurality of first die contacts are solder-free.

In another embodiment, an exemplary wafer-level package includes a first thinned die, a multilayer redistribution structure, a first mold compound, and a second mold compound. The first thinned die includes a first device layer and a first dielectric layer over the first device layer. The first device layer includes a number of first die contacts at a bottom surface of the first device layer. The multilayer redistribution structure includes at least one structure pad, a number of package contacts, and redistribution interconnects. Herein, the first thinned die resides over a top surface of the multilayer redistribution structure. The package contacts are on a bottom surface of the multilayer redistribution structure. The redistribution interconnects connect the package contacts to certain ones of the first die contacts. The at least one structure pad and the redistribution interconnects are formed from a common electrically conductive layer, but the at least one structure pad is electrically isolated from the redistribution interconnects. The at least one structure pad is placed vertically below the first thinned die. In addition, the first mold compound resides over the multilayer redistribution structure and around the first thinned die, and extends beyond a top surface of the first thinned die to define an opening within the first mold compound and over the first thinned die. The top surface of the first thinned die is exposed at a bottom of the opening. The second mold compound fills the opening and is in contact with the top surface of the first thinned die.

According to an exemplary process, a mold wafer having a first die and a first mold compound is provided. Herein, the first die includes a first device layer, a first dielectric layer over the first device layer, and a first silicon substrate over the first dielectric layer. The first device layer includes a number of first die contacts at a bottom surface of the first device layer. A top surface of the first die is a top surface of the first silicon substrate and a bottom surface of the first die is the bottom surface of the first device layer. The first mold compound encapsulates the sides and the top surface of the first die, and the bottom surface of the first device layer is exposed. Next, a multilayer redistribution structure is formed underneath the mold wafer. The multilayer redistribution structure includes at least one first support pad, a number of package contacts, and redistribution interconnects. The at least one first support pad is on a bottom surface of the multilayer redistribution structure and vertically aligned with the first die, such that the at least one first support pad is placed vertically below the first die. The package contacts are on the bottom surface of the multilayer redistribution structure and electrically isolated from the at least one first support pad. The redistribution interconnects connect the package contacts to certain ones of the first die contacts. The first mold compound is then thinned down to expose the top surface of the first silicon substrate. The first silicon substrate of the first die is removed substantially to provide a first thinned die and form a first opening within the first mold compound and over the first thinned die. The at least one first support pad is vertically below the first thinned die, and the first thinned die has a top surface exposed at a bottom of the first opening. Lastly, a second mold compound is applied to substantially fill the opening and directly contact the top surface of the first thinned die.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

Figure 1:
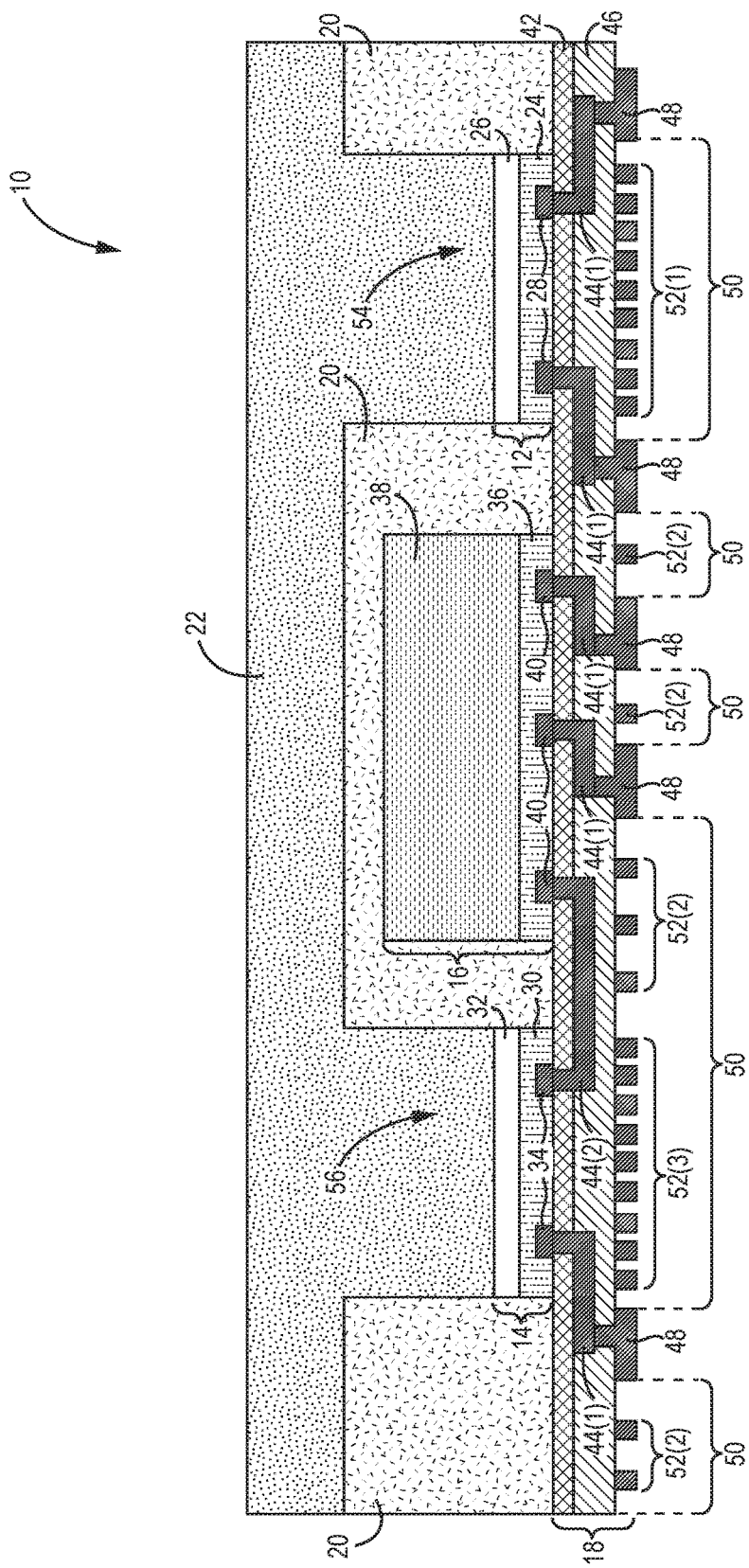
FIG. 1 shows an exemplary wafer-level package according to one embodiment of the present disclosure.

FIGS. 4-18 provide exemplary steps that illustrate a process to fabricate the exemplary wafer-level package shown in FIG. 1.

It will be understood that for clear illustrations, FIGS. 1-18 may not be drawn to scale.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

The present disclosure relates to a wafer-level package with enhanced thermal, electrical, and rigidity performance, and a packaging process for making the same. FIG. 1 shows an exemplary wafer-level package 10 according to one embodiment of the present disclosure. For the purpose of this illustration, the exemplary wafer-level package 10 includes a thinned silicon-on-insulator (SOI) die 12, a thinned microelectromechanical systems (MEMS) die 14, a complementary metal-oxide-semiconductor (CMOS) controller die 16, a multilayer redistribution structure 18, a first mold compound 20, and a second mold compound 22. In different applications, the wafer-level package 10 may include fewer or more thinned MEMS/SOI dies and may include other dies, such as: thinned integrated passive device dies (not shown). For instance, in some applications, the wafer-level package 10 may only include thinned MEMS dies and CMOS controller dies; and in some applications, the wafer-level package 10 may only include thinned SOI dies.

In detail, the thinned SOI die 12 includes a first device layer 24 and a first dielectric layer 26 over a top surface of the first device layer 24. The first device layer 24 includes a number of first die contacts 28 at a bottom surface of the first device layer 24. Herein, the thinned SOI die 12 is formed from an SOI structure, which refers to a structure including a silicon substrate, a silicon epitaxy layer, and a buried oxide layer sandwiched between the silicon substrate and the silicon epitaxy layer. The first device layer 24 of the thinned SOI die 12 is formed by integrating electronic components (not shown) in or on the silicon epitaxy layer of the SOI structure. The first dielectric layer 26 of the thinned SOI die 12 is the buried oxide (BOX) layer of the SOI structure. In addition, the silicon substrate of the SOI structure is removed substantially to complete the thinned SOI die 12 (more details in the following discussion). The first device layer 24 has a thickness between 0.1 µm and 50 µm, and the first dielectric layer 26 has a thickness between 10 nm and 2000 nm.

The thinned MEMS die 14 includes a second device layer 30 and a second dielectric layer 32 over a top surface of the second device layer 30. The second device layer 30 includes a MEMS component (not shown) that is typically a switch and a number of second die contacts 34 at a bottom surface of the second device layer 30. Via-structures (not shown) may be used to connect the MEMS component (not shown) to the second die contacts 34. The second device layer 30 has a thickness between 0.5 µm and 100 µm, and may be formed from a combination of dielectric and metal layers (such as silicon oxide, silicon nitride, aluminum, titanium, copper, or the like). The second dielectric layer 32 has a thickness between 10 nm and 10000 nm, and may be formed from silicon oxide, silicon nitride, or aluminum nitride.

Notice that the thinned SOI die 12 and the thinned MEMS die 14 are both thinned dies, which have a device layer, a dielectric layer over the device layer, and essentially no silicon substrate over the dielectric layer. Herein, essentially no silicon substrate over the dielectric layer refers to at most 2 µm silicon substrate over the dielectric layer. In desired cases, each thinned die does not include any silicon substrate over the dielectric layer such that a top surface of each thinned die is a top surface of the dielectric layer. For other cases, the top surface of one thinned die may be a top surface of the thin silicon substrate.

The CMOS controller die 16 includes a third device layer 36 and a silicon substrate 38 over the third device layer 36. The third device layer 36 may include a CMOS controller (not shown) that controls the MEMS component (not shown) within the thinned MEMS die 14, and a number of third die contacts 40 at a bottom surface of the third device layer 36. Via-structures (not shown) may be used to connect the CMOS controller (not shown) to the third die contacts 40. The third device layer 36 has a thickness between 0.1 µm and 50 µm, and may be formed from a combination of dielectric and metal layers (such as silicon oxide, silicon nitride, aluminum, titanium, copper, or the like). The CMOS controller die 16 is an intact die, which includes the intact silicon substrate 38 with a thickness between 25 µm and 250 µm or between 10 µm and 750 µm.

Herein, the multilayer redistribution structure 18 includes a first dielectric pattern 42 at the top, a number of redistribution interconnects 44, a second dielectric pattern 46, and a number of package contacts 48. In one embodiment, the thinned SOI die 12, the thinned MEMS die 14, and the CMOS controller die 16 reside directly over the multilayer redistribution structure 18. As such, the first device layer 24 of the thinned SOI die 12, the second device layer 30 of the thinned MEMS die 14, and the third device layer 36 of the CMOS controller die 16 are in contact with the first dielectric pattern 42. In addition, the first die contacts 28 at the bottom surface of the first device layer 24, the second die contacts 34 at the bottom surface of the second device layer 30, and the third die contacts 40 at the bottom surface of the third device layer 36 are exposed through the first dielectric pattern 42.

For the purpose of this illustration, the redistribution interconnects 44 include five first redistribution interconnects 44(1) and one second redistribution interconnect 44(2). In different applications, the redistribution interconnects 44 may include fewer or more first redistribution interconnects 44(1)/second redistribution interconnects 44(2). Each first redistribution interconnect 44(1) connects one package contact 48 to a corresponding one of the first, second, and third die contacts 28, 34, and 40. The second redistribution interconnect 44(2) is used to connect one second die contact 34 to a corresponding third die contact 40, such that the CMOS controller (not shown) within the CMOS controller die 16 electrically connects the MEMS component (not shown) within the thinned MEMS die 14. Herein, each redistribution interconnect 44 is electrically coupled to at least one of the first, second, and third die contacts 28, 34, and 40 through the first dielectric pattern 42 and extends underneath the first dielectric pattern 42. The connections between the redistribution interconnects 44 and the first, second, and third die contacts 28, 34, and 40 are solder-free.

The second dielectric pattern 46 is formed underneath the first dielectric pattern 42. The second dielectric pattern 46 partially encapsulates each first redistribution interconnect 44(1). As such, a portion of each first redistribution interconnect 44(1) is exposed through the second dielectric pattern 46. Further, the second dielectric pattern 46 fully encapsulates the second redistribution interconnect 44(2). As such, no portion of the second redistribution interconnect 44(2) is exposed through the second dielectric pattern 46. In different applications, there may be extra redistribution interconnects (not shown) electrically coupled to the redistribution interconnects 44 through the second dielectric pattern 46, and an extra dielectric pattern (not shown) formed underneath the second dielectric pattern 46 to partially encapsulate each of the extra redistribution interconnects.

In this embodiment, each package contact 48 is on a bottom surface of the multilayer redistribution structure 18 and electrically coupled to a corresponding first redistribution interconnect 44(1) through the second dielectric pattern 46. Consequently, the first redistribution interconnects 44(1) connect the package contacts 48 to certain ones of the first, second, and third die contacts 28, 34, and 40. Herein, the package contacts 48 are separate from each other and extend underneath the second dielectric pattern 46, such that an air gap 50 is formed surrounding each package contact 48. The air gap 50 may extend underneath at least 70% of the thinned SOI die 12 and/or extend underneath at least 70% of the thinned MEMS die 14.

In the present disclosure, the multilayer redistribution structure 18 may further include a number of support pads 52 placed on the bottom surface of the multilayer redistribution structure 18 and within the air gap 50. The support pads 52 and the package contact 48 may be formed from a common electrically conductive layer (like a metal layer), such that each support pad 52 and each package contact 48 have a same thickness protruding from a bottom surface of the second dielectric pattern 46. A bottom surface of each support pad 52 and a bottom surface of each package contact 48 are in a same flat plane. Herein, the support pads 52 are not in contact with and electrically isolated from any package contact 48.

Notice that the thinned SOI die 12 has a thickness between 0.1 µm and 50 µm, the thinned MEMS die 14 has a thickness 0.5 µm and 100 µm, and the multilayer redistribution structure 18 has a thickness between 2 µm and 300 µm. As such, a first combination of the thinned SOI die 12 and a first portion of the multilayer redistribution structure 18 directly underneath the thinned SOI die 12, or a second combination of the thinned MEMS die 14 and a second portion of the multilayer redistribution structure 18 directly underneath the thinned MEMS die 14 may have a thickness as thin as a few µm. If there are no support pads 52 within a first portion of the air gap 50 that is vertically below the thinned SOI die 12, vertical deformations of the first combination may occur during a molding step (more details are described in the following fabrication process). Similarly, if there are no support pads 52 within a second portion of the air gap 50 that is vertically below the thinned MEMS die 14, vertical deformations of the second combination may occur during the molding step (more details are described in following fabrication process). Without extra support in the first and second portions of the air gap 50, the first combination and the second combination may not endure high vertical molding pressure.

Herein, the support pads 52 may include first support pads 52(1), second support pads 52(2), and third support pads 52(3). The first support pads 52(1) are on the bottom surface of the multilayer redistribution structure 18 and vertically aligned with the thinned SOI die 12. As such, the first support pads 52(1) are placed vertically below the thinned SOI die 12. The first support pads 52(1) form 'standoffs' within the first portion of the air gap 50 that is vertically below the thinned SOI die 12. These 'standoffs' provide mechanical support to the thinned SOI die 12 for enduring high molding pressures (more details are described in the following fabrication process). By reducing the distance between the adjacent first support pads 52(1) and/or reducing the distance between the first support pads 52(1) and adjacent package contacts 48, the vertical deformations of the first combination of the thinned SOI die 12 and the first portion of the multilayer redistribution structure 18 may be reduced to an acceptable level. The distance between the adjacent first support pads 52(1) may be between 1 µm and 100 µm, and the distance between the first support pads 52(1) and adjacent package contacts 48 may be between 1 µm and 100 µm.

Further, each first support pad 52(1) may have a same or different size, and may have a same or different shape, such as square, rectangular, triangle, and round. Each first support pad 52(1) may be sized between 5 µm×5 µm and 100 µm×100 µm. The first support pads 52(1) are sized and placed to avoid coupling effects.

The second support pads 52(2) are placed on the bottom surface of the multilayer redistribution structure 18, but not placed vertically below the thinned SOI die 12 or vertically below the thinned MEMS die 14. For instance, the second support pads 52(2) may be vertically below the first mold compound 20 and/or vertically below the CMOS controller die 16. The second support pads 52(2) provide extra mechanical support to the wafer-level package 10 for enduring high molding pressure. The distance between the adjacent second support pads 52(2) may be between 1 µm and 100 µm, and the distance between the second support pads 52(2) and adjacent package contacts 48 may be between 1 µm and 100 µm. Further, each second support pad 52(2) may have a same or different size, and may have a same or different shape, such as square, rectangular, triangle, and round. Each second support pad 52(2) may be sized between 5 µm×5 µm and 100 µm×100 µm. The second support pads 52(2) are sized and placed to avoid coupling effects. In some applications, there may be no second support pads 52(2) (referring to no support pads 52 are vertically below the first mold compound 20 and/or the CMOS controller die 16). If the first support pads 52(1) are placed at a first average density and the second support pads 52(2) are placed at a second average density, the second average density may be the same or different as the first average density. In this embodiment, the second average density is desired to be no more than the first average density.

The third support pads 52(3) are on the bottom surface of the multilayer redistribution structure 18 and vertically aligned with the thinned MEMS die 14. As such, the third support pads 52(3) are placed vertically below the thinned MEMS die 14. The third support pads 52(3) form 'standoffs' within the second portion of the air gap 50, which is vertically below the thinned MEMS die 14, to provide mechanical support to the thinned MEMS die 14. By reducing the distance between the adjacent third support pads 52(3) and/or reducing the distance between the third support pads 52(3) and adjacent package contacts 48, the vertical deformations of the second combination of the thinned MEMS die 14 and the second portion of the multilayer redistribution structure 18 may be reduced to an acceptable level. The distance between the adjacent third support pads 52(3) may be between 1 µm and 100 µm, and the distance between the third support pads 52(3) and adjacent package contacts 48 may be between 1 µm and 100 µm. Further, each third support pad 52(3) may have a same or different size, and may have a same or different shape, such as square, rectangular, triangle, and round. Each third support pad 52(3) may be sized between 5 µm×5 µm and 100 µm×100 µm. The third support pads 52(3) are sized and placed to avoid coupling effects. If the third support pads 52(3) are placed at a third average density, the first average density, the second average density, and the third average density may be the same or different. In this embodiment, the second average density is desired to be no more than the third average density, while the first average density may be essentially equal to the third average density.

Herein, the first support pads 52(1), the second support pads 52(2), and the third support pads 52(3) have no electrical purpose but enhance rigidity of the entire wafer-level package 10. The first support pads 52(1), the second support pads 50(2), and the third support pads 50(3) are sized and placed to reduce vertical deformations as well as minimize performance impact and comply with manufacturability rules (line, space). In some applications, there may be one continuous first support pad 52(1) (not shown) instead of a number of discrete first support pads 52(1) vertically below the thinned SOI die 12. In some applications, there may be one continuous third support pad 52(3) (not shown) instead of a number of discrete third support pads 52(3) vertically below the thinned MEMS die 14. In some applications, the first, second and third support pads 52(1), 52(2), and 52(3) are connected together as one continuous support pad (not shown), which extends within the air gap 50 and is electrically isolated from any package contact 48.

Further, the multilayer redistribution structure 18 may be free of glass fiber or glass-free. Herein, the glass fiber refers to individual glass strands twisted to become a larger grouping. These glass strands may then be woven into a fabric. The first dielectric pattern 42 and the second dielectric pattern 46 may be formed of Benzocyclobutene (BCB) or polyimide. The redistribution interconnects 44 may be formed of copper or other suitable metals. The package contacts 48 and the support pads 52 may be formed of at least one of copper, gold, nickel, and palladium.

The first mold compound 20 resides over a top surface of the multilayer redistribution structure 18, resides around the thinned SOI die 12 and the thinned MEMS die 14, and encapsulates the CMOS controller die 16. Further, the first mold compound 20 extends beyond a top surface of the thinned SOI die 12 to define a first opening 54 within the first mold compound 20 and over the thinned SOI die 12, and extends beyond a top surface of the thinned MEMS die 14 to define a second opening 56 within the first mold compound 20 and over the thinned MEMS die 14. Herein, the top surface of the thinned SOI die 12 is exposed at a bottom of the first opening 54, and the top surface of the thinned MEMS die 14 is exposed at a bottom of the second opening 56.

The second mold compound 22 substantially fills the first and second openings 54 and 56, and is in contact with the top surface of the thinned SOI die 12 and the top surface of the thinned MEMS die 14. The second mold compound 22 has a thermal conductivity greater than 2 W/m·K or greater than 10 W/m·K, and has an electrical resistivity greater than 1 E6 Ohm-cm. In general, the higher the thermal conductivity of the second mold compound 22, the better the thermal performance of the thinned SOI die 12 and the thinned MEMS die 14. Further, the high electrical resistivity of the second mold compound 22 may improve the quality factor (Q) at high frequencies of the MEMS component (not shown) of the thinned MEMS die 14.

The second mold compound 22 may be formed of thermoplastics or thermoset materials, such as PPS (poly phenyl sulfide), overmold epoxies doped with boron nitride or alumina thermal additives, or the like. In some applications, if the wafer-level package 10 only includes the thinned MEMS die 14 and the CMOS controller die 16, The second mold compound 22 may also be formed from an organic epoxy resin system with a thermal conductivity less than 2 W/m·K. The second mold compound 22 may be formed of the same or different material as the first mold compound 20. However, unlike the second mold compound 22, the first mold compound 20 does not have thermal conductivity or electrical resistivity requirements. In some applications, both the first mold compound 20 and the second mold compound 22 have a thermal conductivity greater than 2 W/m·K. In some applications, the first mold compound 20 has a thermal conductivity less than 2 W/m·K and the second mold compound 22 has a thermal conductivity greater than 2 W/m·K. In some applications, the first mold compound 20 has a thermal conductivity greater than 2 W/m·K and the second mold compound 22 has a thermal conductivity greater than 10 W/m·K. Herein, a portion of the second mold compound 22 may reside over a top surface of the first mold compound 20. Notice that the second mold compound 22 is separated from the CMOS controller die 16 by the first mold compound 20. A top surface of the CMOS controller die 16 is in contact with the first mold compound 20.

Figure 2:
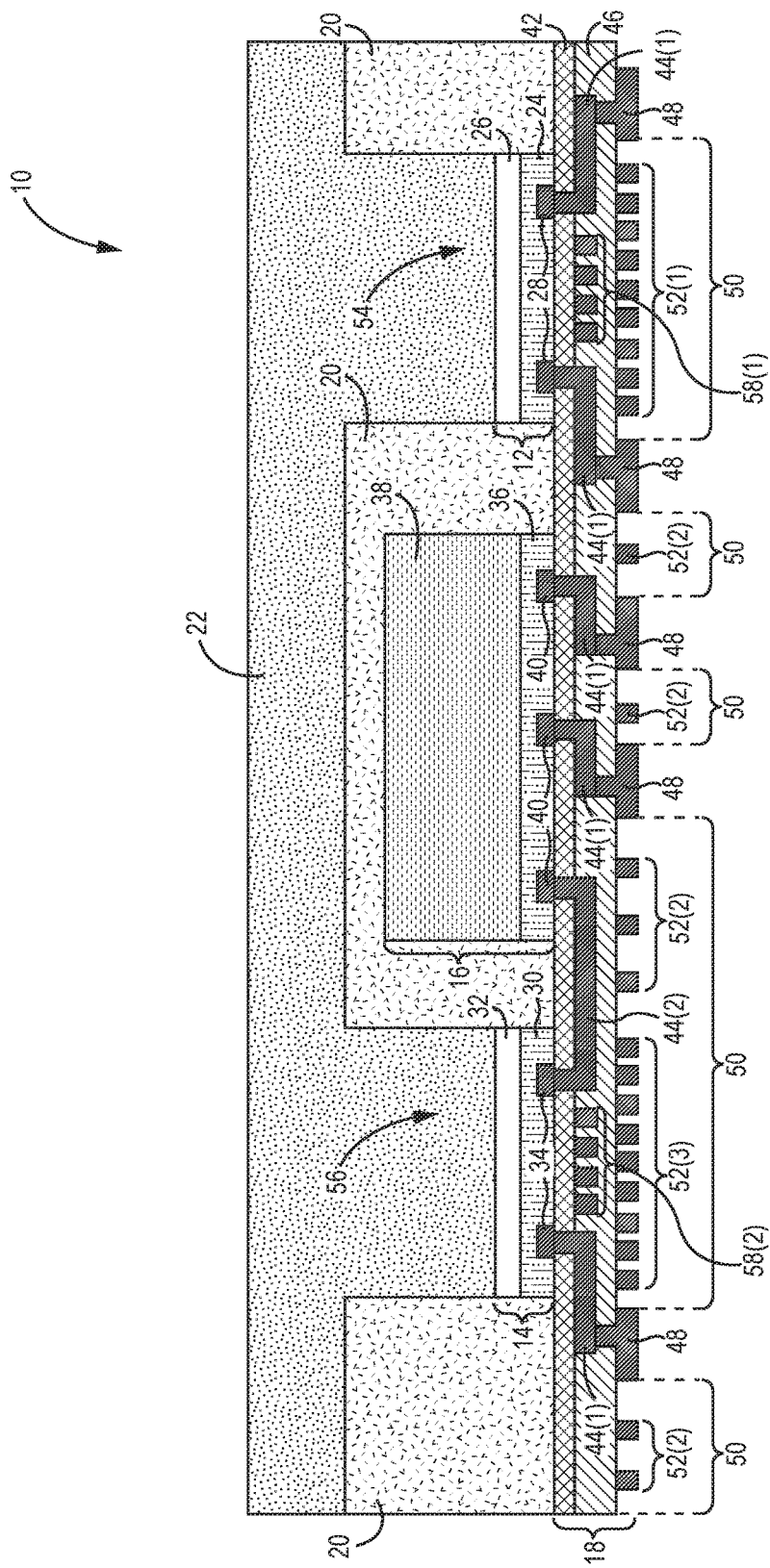
FIG. 2 shows an alternative wafer-level package according to another embodiment of the present disclosure.

In another embodiment, the multilayer redistribution structure 18 may further include a number of structure pads 58, which are directly underneath the first dielectric pattern 42 and encapsulated by the second dielectric pattern 46, as illustrated in FIG. 2. The structure pads 58 and the redistribution interconnects 44 may be formed from a common electrically conductive layer (like a metal layer), therefore each structure pad 58 and each redistribution interconnect 44 have a same thickness protruding from a bottom surface of the first dielectric pattern 42. Consequently, the thickness of the multilayer redistribution structure 18 will not increase. Herein, the structure pads 58 are not in contact with and electrically isolated from any redistribution interconnect 44.

The structure pads 58 may include first structure pads 58(1) vertically below the thinned SOI die 12 and second structure pads 58(2) vertically below the thinned MEMS die 14. The first structure pads 58(1) increase the structural stiffness of the multilayer redistribution structure 18 and allow the thinned SOI die 12 to endure high molding pressures. Consequently, the vertical deformations of the first combination of the thinned SOI die 12 and the first portion of the multilayer redistribution structure 18 may be reduced to an acceptable level. The distance between the adjacent first structure pads 58(1) may be between 1 µm and 100 µm, and the distance between the first structure pads 58(1) and adjacent redistribution interconnects 44 may be between 1 µm and 100 µm. Further, each first structure pad 58(1) may have a same or different size, and may have a same or different shape, such as square, rectangular, triangle, and round. Each first structure pad 58(1) may be sized between 5 µm×5 µm and 100 µm×100 µm. The first structure pads 58(1) are sized and placed to avoid coupling effects.

Similarly, the second structure pads 58(2) increase the structural stiffness of the multilayer redistribution structure 18 and allow the thinned MEMS die 14 to endure high molding pressures. Consequently, the vertical deformations of the second combination of the thinned MEMS die 14 and the second portion of the multilayer redistribution structure 18 may be reduced to an acceptable level. The distance between the adjacent second structure pads 58(2) may be between 1 µm and 100 µm, and the distance between the second structure pads 58(2) and adjacent redistribution interconnects 44 may be between 1 µm and 100 µm.

Further, each second structure pads 58(2) may have a same or different size, and may have a same or different shape, such as square, rectangular, triangle, and round. Each second structure pad 58(2) may be sized between 5 µm×5 µm and 100 µm×100 µm. The second structure pads 58(2) are sized and placed to avoid coupling effects. In some applications, there may be one continuous first structure pad 58(1) (not shown) instead of a number of discrete first structure pads 58(1) vertically below the thinned SOI die 12. In some applications, there may be one continuous second structure pad 58(2) (not shown) instead of a number of discrete second structure pads 58(2) vertically below the thinned MEMS die 14.

Figure 3:
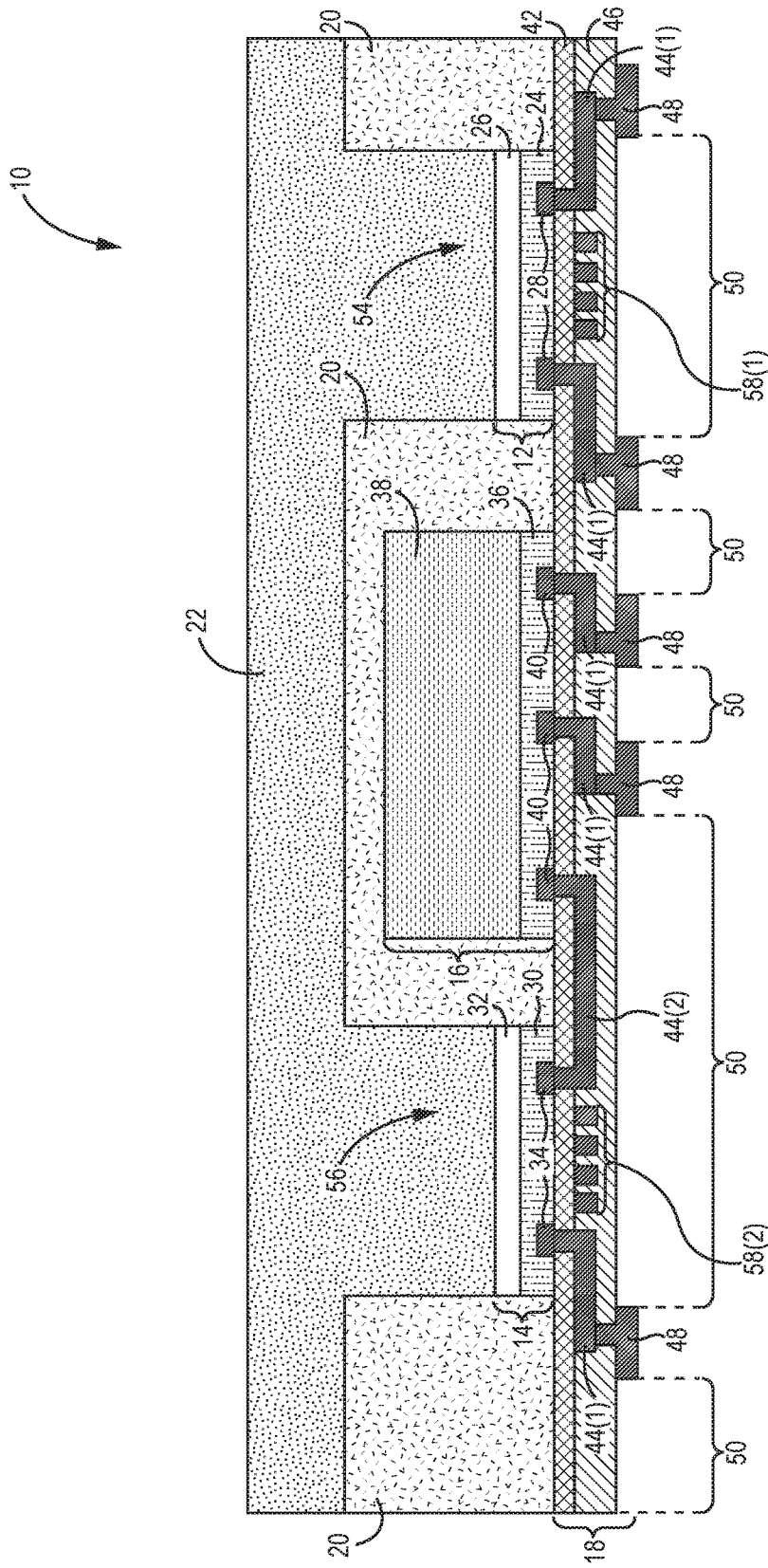
FIG. 3 shows an alternative wafer-level package according to another embodiment of the present disclosure.

In another embodiment, the multilayer redistribution structure 18 may include the structure pads 58, but not include the support pads 52, as illustrated in FIG. 3. Although there is no extra support within the first portion of the air gap 50 that is vertically below the thinned SOI die 12, the first structure pads 58 (1) increase the structural stiffness of the multilayer redistribution structure 18, such that the first combination of the thinned SOI die 12 and the first portion of the multilayer redistribution structure 18 may still be rigid enough to ensure high molding pressures. The vertical deformations of the first combination of the thinned SOI die 12 and the first portion of the multilayer redistribution structure 18 may be reduced to an acceptable level. Similarly, although there is no extra support within the second portion of the air gap 50 that is vertically below the thinned MEMS die 14, the second structure pads 58(1) increase the structural stiffness of the multilayer redistribution structure 18, such that the second combination of the thinned MEMS die 14 and the second portion of the multilayer redistribution structure 18 may still be rigid enough to ensure high molding pressures. The vertical deformations of the second combination of the thinned MEMS die 14 and the second portion of the multilayer redistribution structure 18 may be reduced to an acceptable level.

FIGS. 4-18 provide exemplary steps to fabricate the exemplary wafer-level package 10 shown in FIG. 1. Although the exemplary steps are illustrated in a series, the exemplary steps are not necessarily order dependent.

Some steps may be done in a different order than that presented. Further, processes within the scope of this disclosure may include fewer or more steps than those illustrated in FIGS. 4-18.

Initially, an adhesive layer 60 is applied on a top surface of a carrier 62 as illustrated in FIG. 4. Then, an SOI die 12D, a MEMS die 14D, and the CMOS controller die 16 are attached to the adhesive layer 60 as illustrated in FIG. 5. In different applications, there might be fewer or more dies attached to the adhesive layer 60. For instance, in some applications, there may be only the SOI die 12D attached to the adhesive layer 60; and in some applications, there may be only the MEMS die 14D and the CMOS controller die 16 attached to the adhesive layer 60.

The SOI die 12D includes the first device layer 24, the first dielectric layer 26 over the top surface of the first device layer 24, and a first silicon substrate 64 over the first dielectric layer 26. As such, the bottom surface of the first device layer 24 is a bottom surface of the SOI die 12D, and the backside of the first silicon substrate 64 is a top surface of the SOI die 12D. Herein, the SOI die 12D is formed from an SOI structure, which refers to a structure including a silicon substrate, a silicon epitaxy layer, and a buried oxide layer sandwiched between the silicon substrate and the silicon epitaxy layer. The first device layer 24 of the SOI die 12D is formed by integrating electronic components (not shown) in or on the silicon epitaxy layer of the SOI structure. The first dielectric layer 26 of the SOI die 12D is the buried oxide layer of the SOI structure. The first silicon substrate 64 of the SOI die 12D is the silicon substrate of the SOI structure. The SOI die 12D has a thickness between 25 μm and 250 μm or between 10 μm and 750 μm, and the first silicon substrate 64 has a thickness between 25 μm and 250 μm or between 10 μm and 750 μm, respectively.

The MEMS die 14D includes the second device layer 30, the second dielectric layer 32 over the top surface of the second device layer 30, and a second silicon substrate 66 over the second dielectric layer 32. As such, the bottom surface of the second device layer 30 is a bottom surface of the MEMS die 14D, and the backside of the second silicon substrate 66 is a top surface of the MEMS die 14D. The MEMS die 14D has a thickness between 25 μm and 300 μm or between 10 μm and 800 μm, and the second silicon substrate 66 has a thickness between 25 μm and 300 μm or between 10 μm and 800 μm, respectively. In this embodiment, the CMOS controller die 16 may be shorter than the SOI die 12D and the MEMS die 14D. In different applications, the CMOS controller die 16 may be the same height as the SOI die 12D or the MEMS die 14D, or the CMOS controller die 16 may be taller than the SOI die 12D and the MEMS die 14D.

Next, the first mold compound 20 is applied over the adhesive layer 60 to encapsulate the SOI die 12D, the MEMS die 14D, and the CMOS controller die 16 as illustrated in FIG. 6. The first mold compound 20 may be an organic epoxy resin system or the like, which can be used as an etchant barrier to protect the SOI die 12D, the MEMS die 14D, and the CMOS controller die 16 against etching chemistries such as potassium hydroxide (KOH), sodium hydroxide (NaOH), and acetylcholine (ACH). The first mold compound 20 may be applied by various procedures, such as sheet molding, overmolding, compression molding, transfer molding, dam fill encapsulation, or screen print encapsulation. In a typical compression molding, a molding pressure used for applying the first mold compound 20 is between 100 psi and 1000 psi. Since the SOI die 12D, the MEMS die 14D, and the CMOS controller die 16 are relatively thick and the bottom surfaces of the SOI die 12D, the MEMS die 14D, and the CMOS controller die 16 are essentially flat, there may be no vertical deformations occurring to the SOI die 12D, the MEMS die 14D, or the CMOS controller die 16 during this molding step.

A curing process (not shown) is then used to harden the first mold compound 20. The curing temperature is between 100° C. and 320° C. depending on which material is used as the first mold compound 20. The adhesive layer 60 and the carrier 62 are then removed to expose the bottom surface of the first device layer 24, the bottom surface of the second device layer 30, and the bottom surface of the third device layer 36 as shown in FIG. 7. Removal of the adhesive layer 60 and the carrier 62 may be provided by heating the adhesive layer 60.

Figure 8:
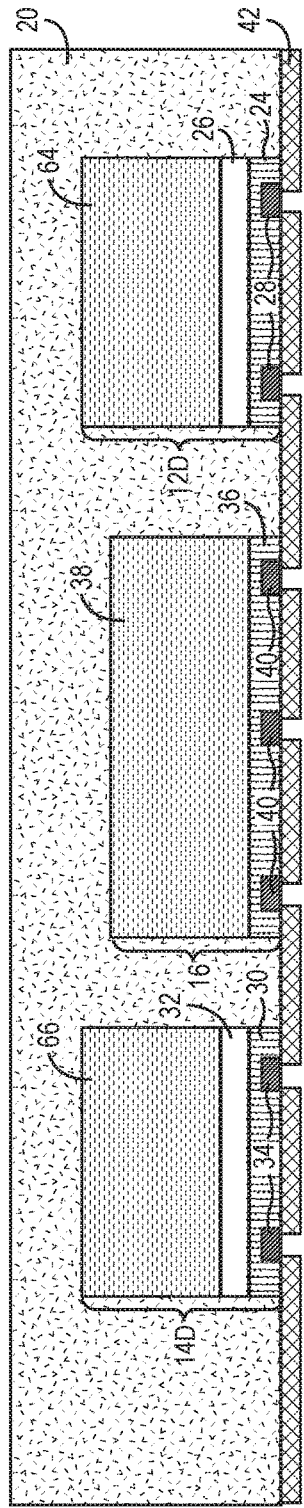

With reference to FIGS. 8 through 12, the multilayer redistribution structure 18 is formed according to one embodiment of the present disclosure. The first dielectric pattern 42 is firstly formed underneath the SOI die 12D, the MEMS die 14D, and the CMOS controller die 16, as illustrated in FIG. 8. As such, the first, second, and third die contacts 28, 34, and 40 are exposed through the first dielectric pattern 42.

Figure 9:
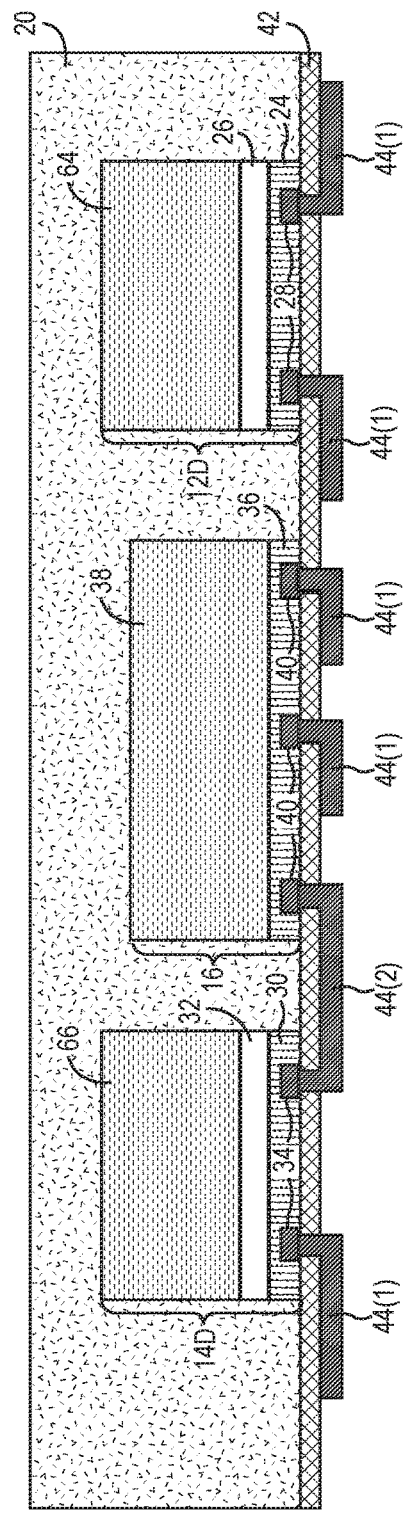

Next, the redistribution interconnects 44 are formed as illustrated in FIG. 9. Herein, the redistribution interconnects 44 includes five first redistribution interconnects 44(1) and one second redistribution interconnect 44(2). In different applications, the redistribution interconnects 44 may include fewer or more first redistribution interconnects 44(1)/second redistribution interconnects 44(2). The first redistribution interconnects 44(1) are electrically coupled to the first, second, and third die contacts 28, 34, and 40 through the first dielectric pattern 42 and extend underneath the first dielectric pattern 42. The second redistribution interconnect 44(2) is used to connect one second die contact 34 to a corresponding third die contact 40, such that the CMOS controller (not shown) within the CMOS controller die 16 electrically connects the MEMS component (not shown) within the thinned MEMS die 14. The second redistribution interconnect 44(2) may also extend underneath the first dielectric pattern 42. The connections between the redistribution interconnects 44 and the first, second, and third die contacts 28, 34, and 40 are solder-free. If there are the structure pads 58 included in the multilayer redistribution structure 18, the structure pads 58 may be formed simultaneously with the redistribution interconnects 44 from a common electrically conductive layer (not shown).

Figure 10:
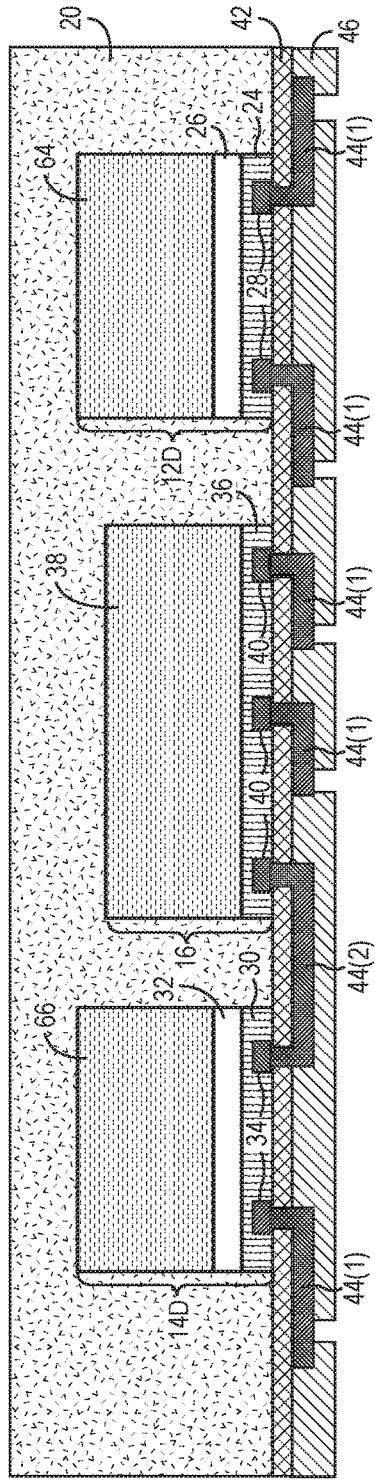

The second dielectric pattern 46 is formed underneath the first dielectric pattern 42 to partially encapsulate each first redistribution interconnect 44(1) as illustrated in FIG. 10. As such, a portion of each first redistribution interconnect 44(1) is exposed through the second dielectric pattern 46. Further, the second dielectric pattern 46 fully encapsulates the second redistribution interconnect 44(2). As such, no portion of the second redistribution interconnect 44(2) is exposed through the second dielectric pattern 46. If there are the structure pads 58 included in the multilayer redistribution structure 18, the second dielectric pattern 46 fully encapsulates each structure pad 58. As such, no portion of each structure pad 58 is exposed through the second dielectric pattern 46.

Figure 11:
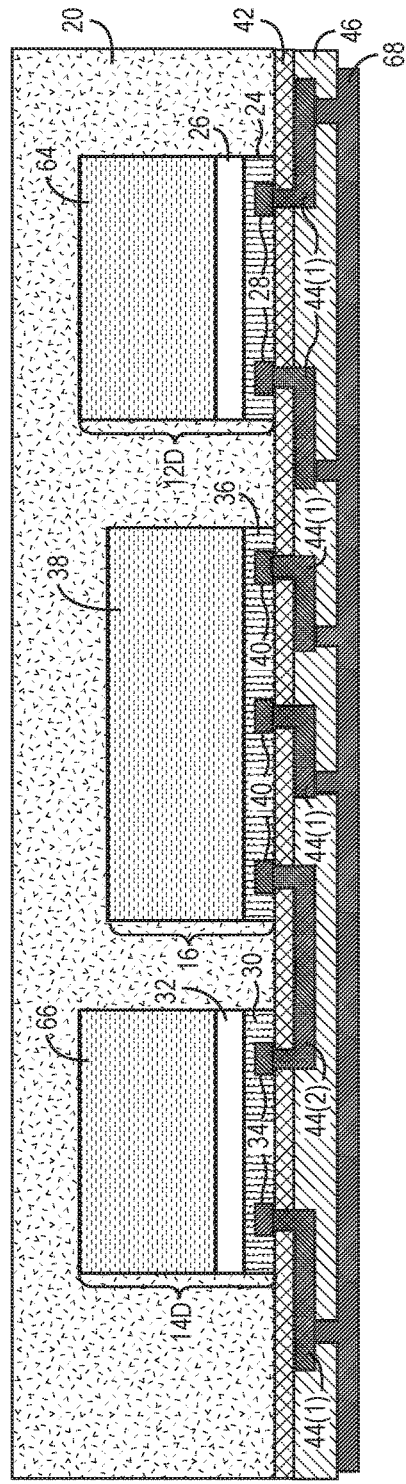
Figure 12:
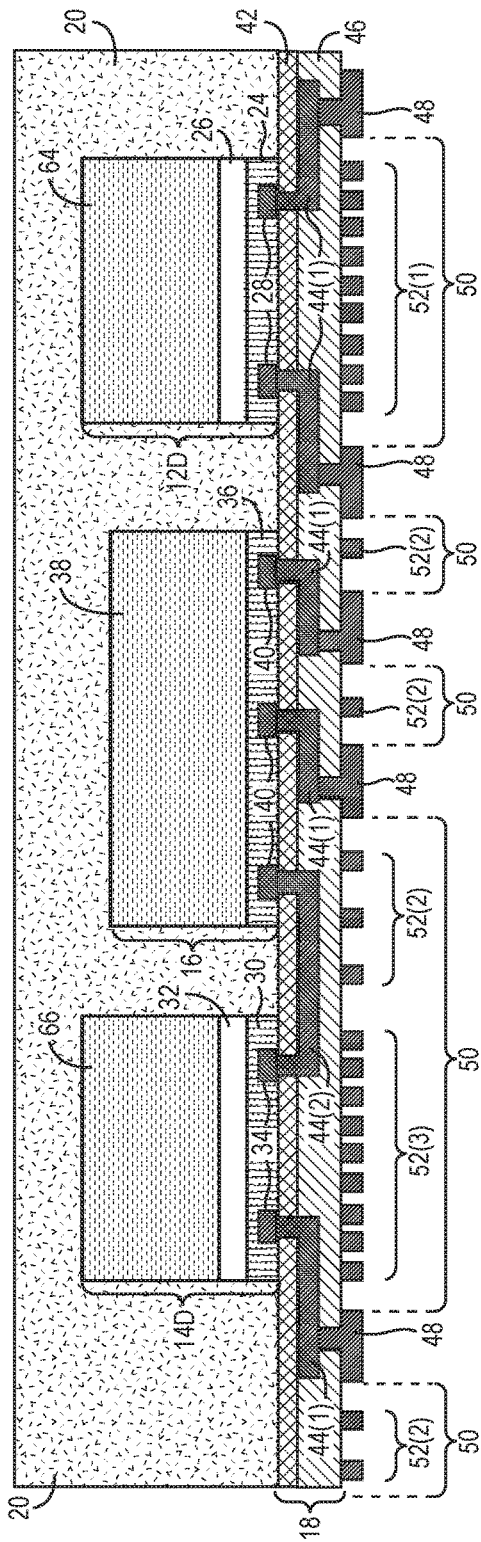

An electrically conductive layer 68 is then formed as illustrated in FIG. 11. The electrically conductive layer 68 may be formed of at least one of copper, gold, nickel, and palladium, and is electrically coupled to each first redistribution interconnect 44(1). The electrically conductive layer 68 extends underneath the second dielectric pattern 46 and has a flat bottom surface. Lastly, the package contacts 48 and the support pads 52 are formed simultaneously by patterning the common electrically conductive layer 68, as illustrated in FIG. 12. In different applications, the package contacts 48 and the support pads 52 may not be formed from a common layer and may be formed sequentially (not shown). In any case, the bottom surface of each package contact 48 and the bottom surface of each support pad 52 are in a same flat plane. The support pads 52 are not in contact with and electrically isolated from any package contact 48.

In this embodiment, each package contact 48 is electrically coupled to a corresponding first redistribution interconnect 44(1) through the second dielectric pattern 46. Consequently, the first redistribution interconnects 44(1) connect the package contacts 48 to certain ones of the first, second, and third die contacts 28, 34, and 40. The support pads 52 are formed within the air gap 50, which is surrounding each package contact 48. However, the support pads 52 are not in contact with and electrically isolated from any package contact 48.

Herein, the support pads 52 may include the first support pads 52(1), the second support pads 52(2), and the third support pads 52(3). The first support pads 52(1) are placed vertically below the SOI die 12D. The third support pads 52(3) are placed vertically below the MEMS die 14D. The second support pads 52(2) are not placed vertically below the SOI die 12D or vertically below the MEMS die 14D. The second support pads 52(2) may be vertically below the first mold compound 20 and/or vertically below the CMOS controller die 16. If the first support pads 52(1) are formed at a first average density, the second support pads 52(2) are formed at a second average density, and the third support pads 52(3) are formed at a third average density, the first average density, the second average density, and the third average density may be the same or different. In this embodiment, the second average density is desired to be no more than the first average density or the third average density, while the first average density may be essentially equal to the third average density.

Figure 13:
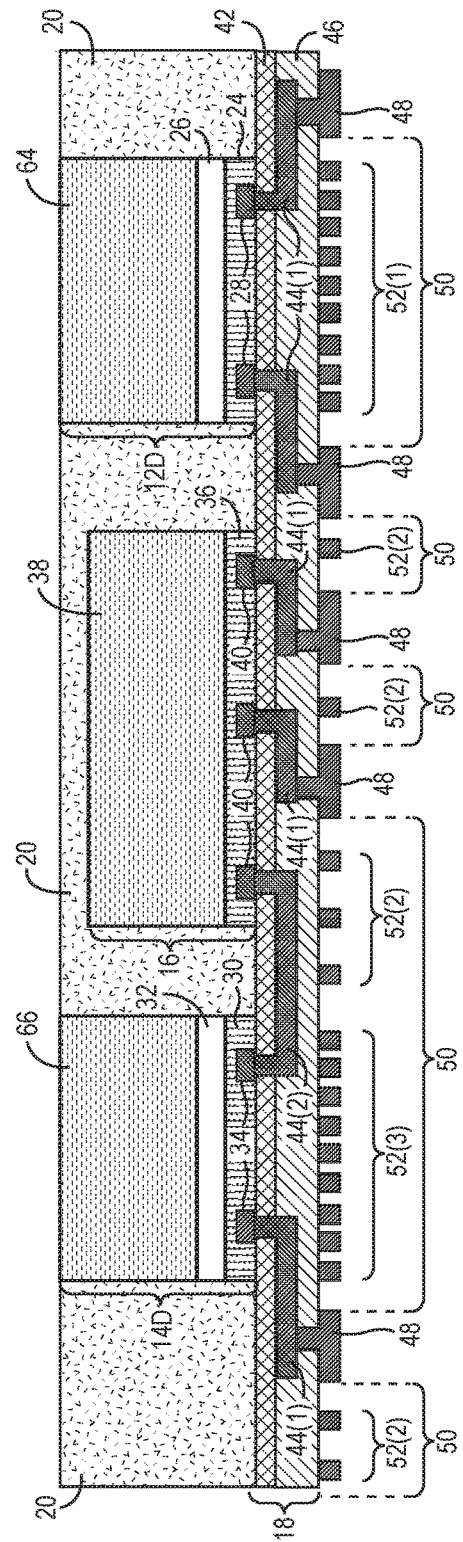

After the multilayer redistribution structure 18 is formed, the first mold compound 20 is thinned down to expose the first silicon substrate 64 of the SOI die 12D and the second silicon substrate 66 of the MEMS die 14D as shown in FIG. 13. The thinning procedure may be done with a mechanical grinding process. Since the CMOS controller die 16 has a lower height than both the MEMS die 14D and the SOI die 12D, the silicon substrate 38 of the CMOS controller die 16 is not exposed and still encapsulated by the first mold compound 20.

Figure 14:
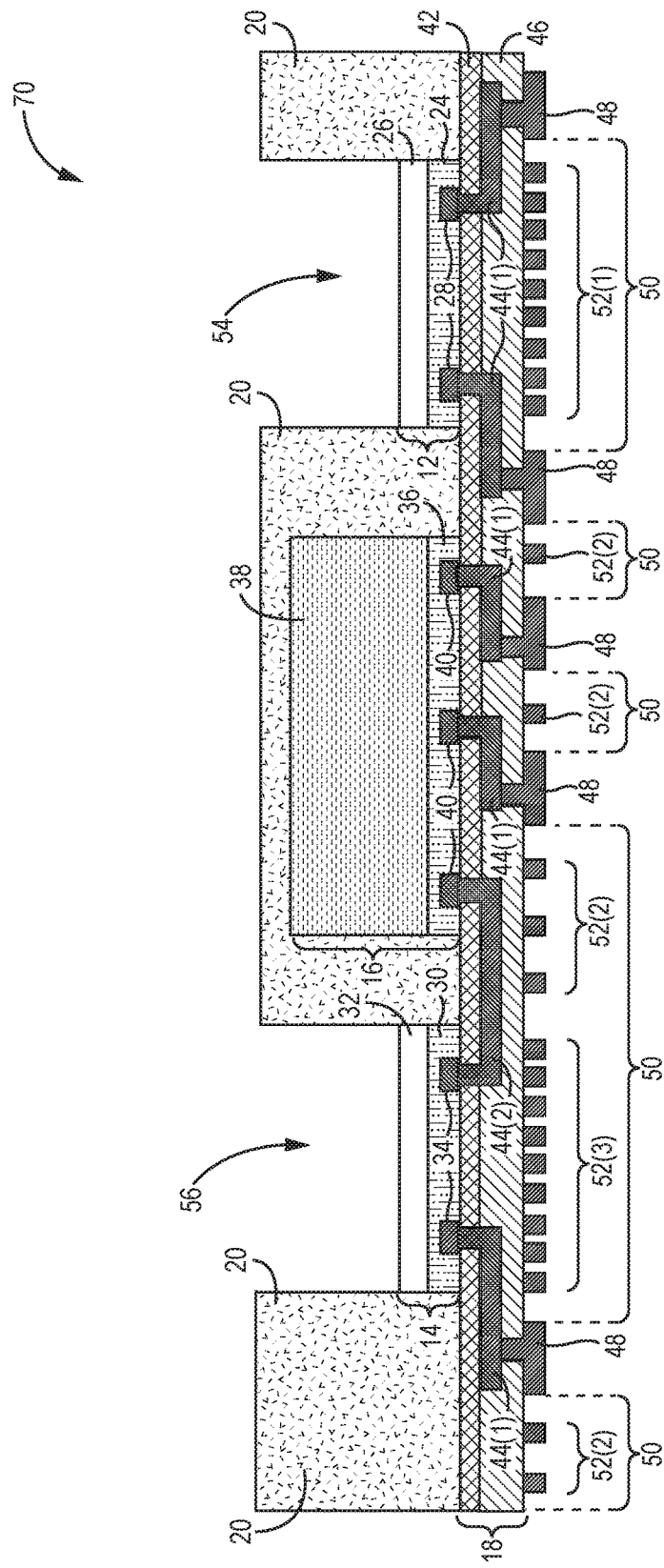

Next, the first silicon substrate 64 and the second silicon substrate 66 are removed substantially to form a precursor package 70, as illustrated in FIG. 14. The removal of the first silicon substrate 64 from the SOI die 12D provides the thinned SOI die 12 and forms the first opening 54 within the first mold compound 20 and over the thinned SOI die 12. The removal of the second silicon substrate 66 from the MEMS die 14D provides the thinned MEMS die 14 and forms the second opening 56 within the first mold compound 20 and over the thinned MEMS die 14. Herein, removing substantially a silicon substrate refers to removing at least 95% of the entire silicon substrate and leaving at most 2 μm silicon substrate. In desired cases, the first and second silicon substrates 62 and 64 are removed completely, such that the first dielectric layer 26 of the thinned SOI die 12 is exposed at the bottom of the first opening 54 and the second dielectric layer 32 of the thinned MEMS die 14 is exposed at the bottom of the second opening 56.

Removing substantially the first and second silicon substrates 62 and 64 may be provided by an etching process with a wet/dry etchant chemistry, which may be TMAH, KOH, ACH, NaOH, or the like. The first dielectric layer 26 functions as an etching stop to protect the first device layer 24 of the thinned SOI die 12, and the second dielectric layer 32 functions as an etching stop to protect the second device layer 30 of the thinned MEMS die 14. The first mold compound 20 encapsulates and protects the CMOS controller die 16 from the wet/dry etchant chemistry. In some applications, a protection layer (not shown) may be placed at the bottom surface of the multilayer redistribution structure 18 to protect the package contacts 48 from the etchant chemistry. The protection layer is applied before the etching process and removed after the etching process. Further, if the silicon substrate 38 of the CMOS controller die 16 is not encapsulated by the first mold compound 20 (in some application, the CMOS controller die 16 has a same height as or is taller than the SOI die 12D and the MEMS die 14D, the silicon substrate 38 of the CMOS controller die 16 will be exposed during the thinning process), there may be an extra protection layer (not shown) placed over the silicon substrate 38 to protect the CMOS controller die 16 from the etchant chemistry. The extra protection layer is applied before the etching process and removed after the etching process.

Figure 15:
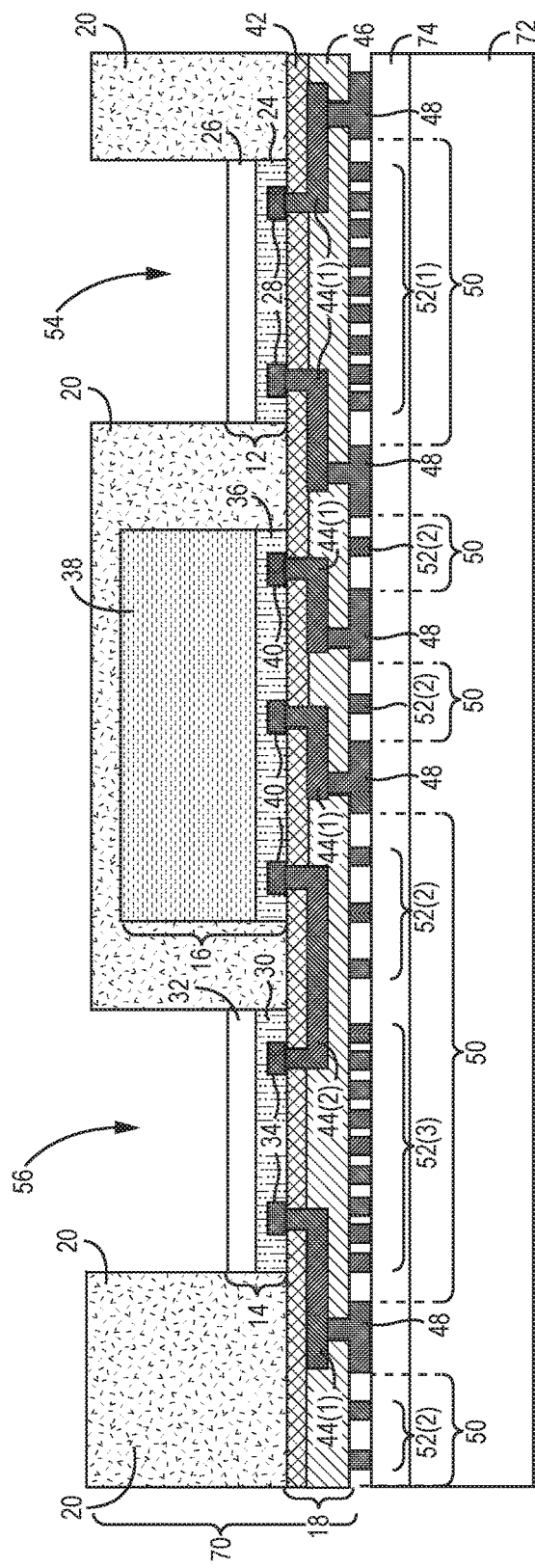

The precursor package 70 may be attached to a rigid carrier 72 via an adhesive material 74, as illustrated in FIG. 15. Herein, the rigid carrier 72 may be a photo-transmissive rigid carrier and formed from quartz, fused silica, or sapphire. The adhesive material 74 may be a UV sensitive adhesive tape or film. The package contacts 48 and the support pads 52 may be in contact with the adhesive material 74. The rigid carrier 72 may help assist with mechanical support of the precursor package 70. In some applications, the precursor package 70 may not be attached to the rigid carrier 72 for the following fabrication steps.

Figure 16:
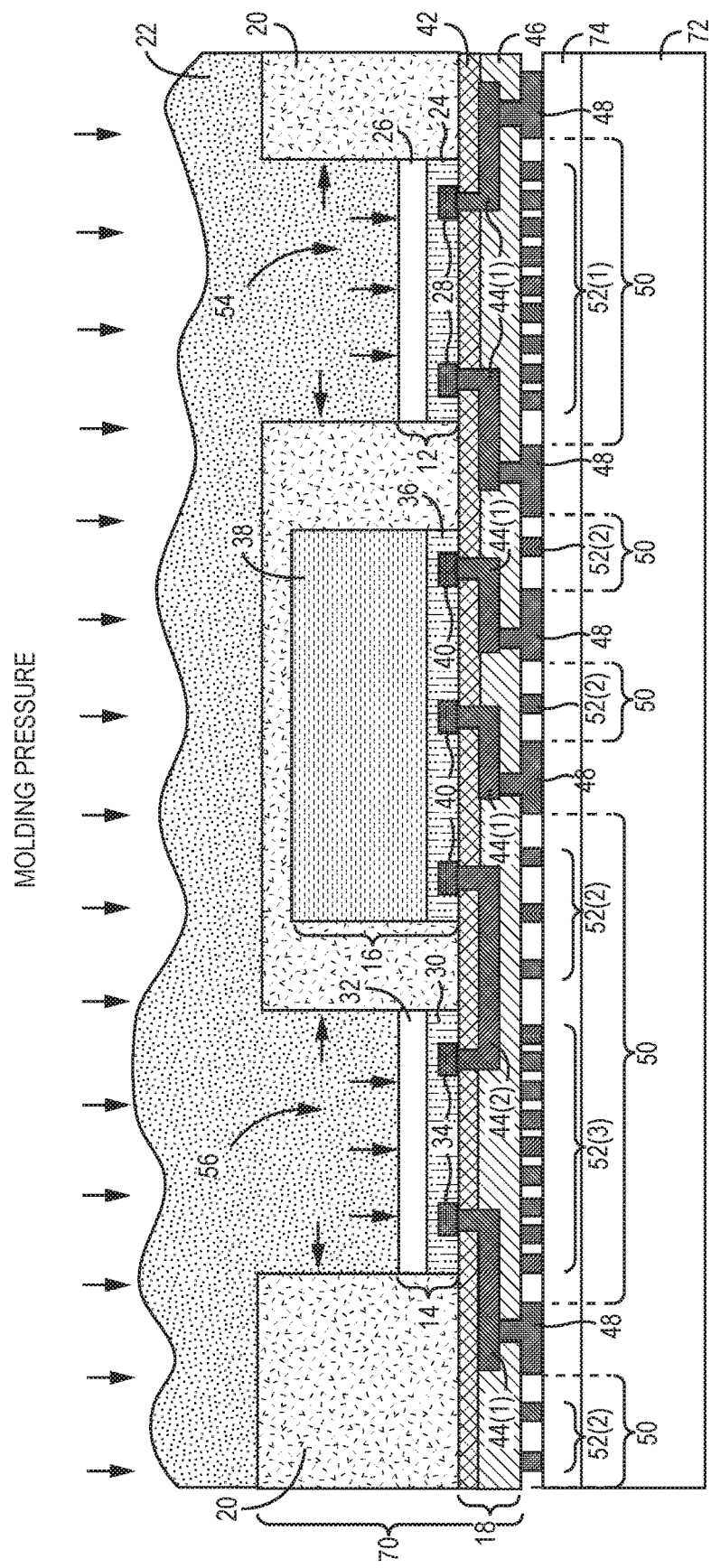

The second mold compound 22 is then applied to substantially fill the first and second openings 54 and 56, as illustrated in FIG. 16. Herein, substantially filling an opening refers to filling at least 75% of the entire opening. The second mold compound 22 directly resides over the top surface of the thinned SOI die 12 and the top surface of the thinned MEMS die 14. If there is no first silicon substrate 64 left in the first opening 54 and no second silicon substrate 66 left in the second opening 56, the second mold compound 22 directly resides over the first dielectric layer 26 and the second dielectric layer 32. In some cases, the second mold compound 22 may further reside over the first mold compound 20.

The second mold compound 22 may be formed of thermoplastics or thermoset materials, such as PPS, overmold epoxies doped with boron nitride or alumina thermal additives, or the like. In some applications, the precursor package 70 may only include the thinned MEMS die 14 and the CMOS controller die 16. The second mold compound 22 may also be formed from an organic epoxy resin system with a thermal conductivity less than 2 W/m·K. The second mold compound 22 may be applied by various procedures, such as sheet molding, overmolding, compression molding, transfer molding, dam fill encapsulation, and screen print encapsulation. During the molding process of the second mold compound 22, liquefaction and molding pressure may not be uniform across the entire precursor package 70. The first combination of the thinned SOI die 12 and the first portion of the multilayer redistribution structure 18, and the second combination of the thinned MEMS die 14 and the second portion of the multilayer redistribution structure 18 may suffer more molding pressure than the other portions of the precursor package 70. In a typical compression molding, if the second mold compound 22 is formed of high thermal conductivity materials (>=2 W/m·K), a molding pressure and a temperature used for applying the second mold compound 22 is between 250 psi and 1000 psi, and between 100° C. and 350° C., respectively.

Notice that the thinned SOI die 12 has a thickness between 0.1 μm and 50 μm, the thinned MEMS die 14 has a thickness 0.5 μm and 100 μm, and the multilayer redistribution structure 18 has a thickness between 2 μm and 300 μm. As such, the first combination of the thinned SOI die 12 and the first portion of the multilayer redistribution structure 18, or the second combination of the thinned MEMS die 14 and the second portion of the multilayer redistribution structure 18 may have a thickness as thin as a few μm. If there is no support within the first portion of the air gap 50 that is vertically below the thinned SOI die 12, the vertical deformations of the first combination may occur at a higher rate. Herein, since the bottom surface of each package contact 48 and the bottom surface of each support pad 52 are in a same flat plane, the first support pads 52(1) form 'standoffs' within the first portion of the air gap 50 to provide mechanical support to the thinned SOI die 12 for enduring high molding pressures. By reducing the distance between the adjacent first support pads 52(1) and/or reducing the distance between the first support pads 52(1) and adjacent package contacts 48, the vertical deformations of the first combination of the thinned SOI die 12 and the first portion of the multilayer redistribution structure 18 may be reduced to an acceptable level.

Similarly, if there is no support within the second portion of the air gap 50 that is vertically below the thinned MEMS die 14, the vertical deformations of the second combination may occur at a higher rate. Herein, since the bottom surface of each package contact 48 and the bottom surface of each support pad 52 are in a same flat plane, the third support pads 52(3) form 'standoffs' within the second portion of the air gap 50 to provide mechanical support to the thinned MEMS die 14 for enduring high molding pressures. By reducing the distance between the adjacent third support pads 52(3) and/or reducing the distance between the third support pads 52(3) and adjacent package contacts 48, the vertical deformations of the second combination of the thinned MEMS die 14 and the second portion of the multilayer redistribution structure 18 may be reduced to an acceptable level.

Further, the second support pads 52(2) provide mechanical support to the CMOS controller die 16 and/or the first mold compound 20. The first support pads 52(1), the second support pads 52(2), and the third support pads 52(3) enhance rigidity of the entire wafer-level package 10.

Figure 17:
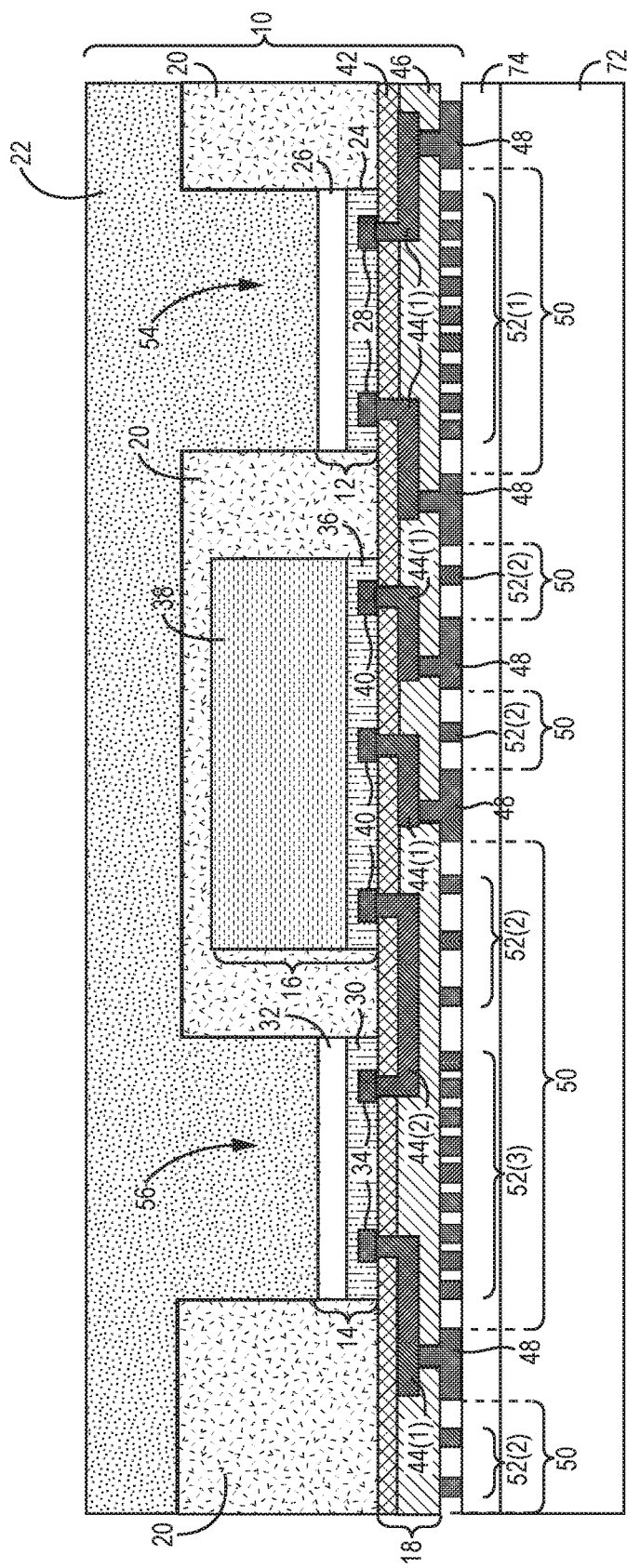

A curing process (not shown) is followed to harden the second mold compound 22. The curing temperature is between 100° C. and 320° C. depending on which material is used as the second mold compound 22. A top surface of the second mold compound 22 is then planarized to form the wafer-level package 10, as illustrated in FIG. 17. If the second mold compound 22 does not cover a top surface of the first mold compound 20, the top surface of the second mold compound 22 and/or the first mold compound 20 are planarized to be coplanar (not shown). A mechanical grinding process may be used for planarization.

Figure 18:
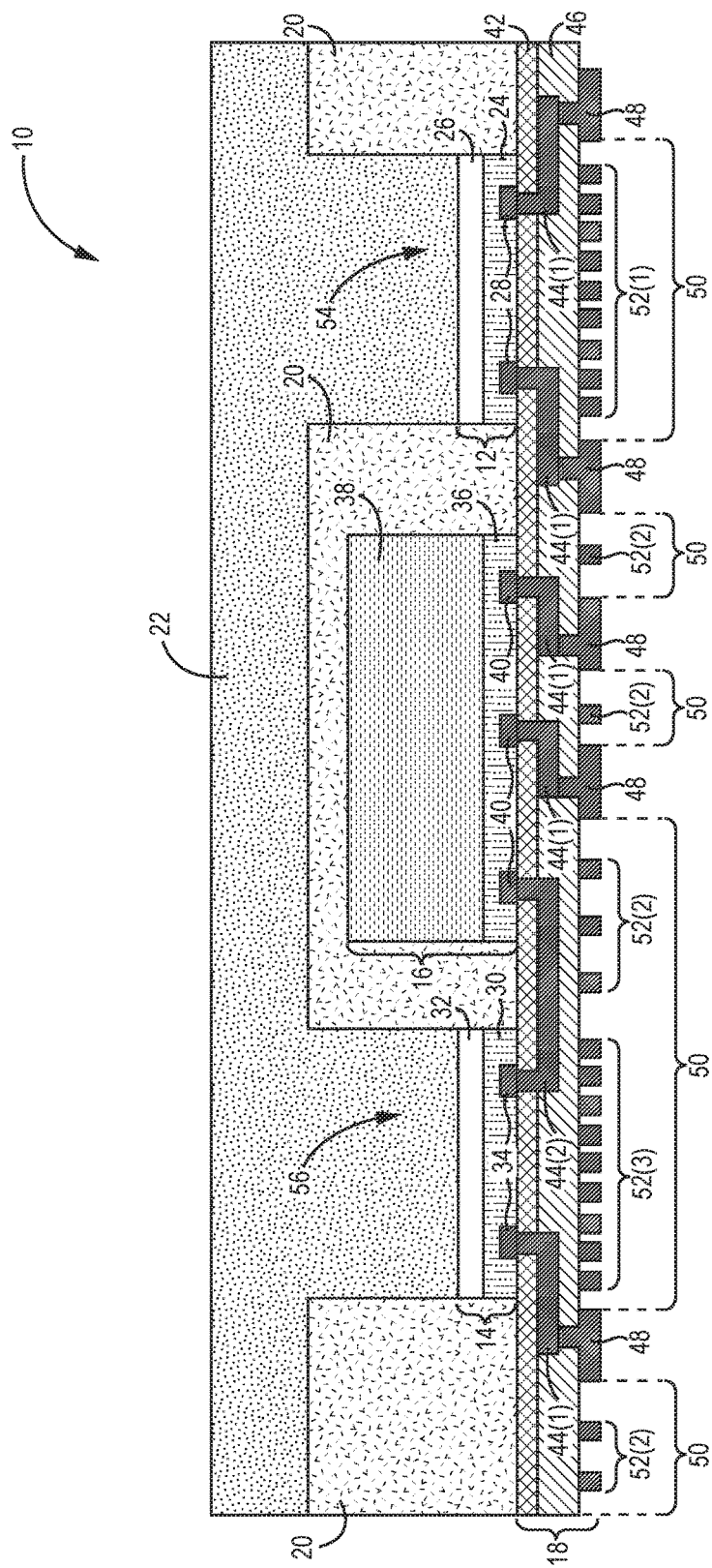

Lastly, the rigid carrier 72 is debonded from the wafer-level package 10 as illustrated in FIG. 18. If the rigid carrier 72 is a photo-transmissive rigid carrier and the adhesive material 74 is a UV sensitive film or tape, the rigid carrier 72 is exposed to a UV environment to achieve the debonding process. The wafer-level package 10 may be marked, diced, and singulated into individual components (not shown).

Those skilled in the art will recognize improvements and modifications to the preferred embodiments of the present disclosure. All such improvements and modifications are considered within the scope of the concepts disclosed herein and the claims that follow.

What is claimed is:

1. An apparatus comprising:
    a first thinned die comprising a first device layer and a first dielectric layer over the first device layer, wherein the first device layer comprises a plurality of first die contacts at a bottom surface of the first device layer;
    a multilayer redistribution structure comprising at least one first support pad, a plurality of package contacts, and redistribution interconnects, wherein:
        the first thinned die resides over a top surface of the multilayer redistribution structure;
        the at least one first support pad is on a bottom surface of the multilayer redistribution structure and vertically aligned with the first thinned die, such that the at least one first support pad is placed vertically below the first thinned die;
        the plurality of package contacts are on the bottom surface of the multilayer redistribution structure; and
        the redistribution interconnects connect the plurality of package contacts to certain ones of the plurality of first die contacts, wherein the at least one first support pad is not in contact with the plurality of package contacts and the redistribution interconnects, and is electrically isolated from the plurality of package contacts, the redistribution interconnects, and the plurality of first die contacts;
    a first mold compound residing over the multilayer redistribution structure and around the first thinned die, and extending beyond a top surface of the first thinned die to define an opening within the first mold compound and over the first thinned die, wherein the top surface of the first thinned die is exposed at a bottom of the opening; and
    a second mold compound filling the opening and in contact with the top surface of the first thinned die.

2. The apparatus of claim 1 wherein the plurality of package contacts and the at least one first support pad are formed from a common electrically conductive layer.

3. The apparatus of claim 1 wherein a bottom surface of the at least one first support pad and a bottom surface of each of the plurality of package contacts are in a same flat plane.

4. The apparatus of claim 1 further comprising at least one second support pad on the bottom surface of the multilayer redistribution structure and not placed vertically below the first thinned die, wherein the at least one second support pad is electrically isolated from the plurality of package contacts and the redistribution interconnects.

5. The apparatus of claim 4 wherein the at least one first support pad and the at least one second support pad are separate.

6. The apparatus of claim 4 wherein the at least one first support pad and the at least one second support pad are connected together.

7. The apparatus of claim 1 wherein the first thinned die provides a microelectromechanical systems (MEMS) component.

8. The apparatus of claim 1 wherein the first thinned die is formed from a silicon-on-insulator (SOI) structure, wherein the first device layer of the first thinned die is formed from a silicon epitaxy layer of the SOI structure, and the first dielectric layer of the first thinned die is a buried oxide layer of the SOI structure.

9. The apparatus of claim 1 further comprising a second intact die residing over the top surface of the multilayer redistribution structure, wherein:
    the second intact die has a second device layer and an intact silicon substrate over the second device layer; and
    the first mold compound encapsulates the second intact die.

10. The apparatus of claim 9 wherein the first thinned die provides a MEMS component and the second intact die provides a complementary metal-oxide-semiconductor (CMOS) controller that controls the MEMS component.

11. The apparatus of claim 9 further comprising a third thinned die residing over the top surface of the multilayer redistribution structure, wherein:
    the third thinned die has a third device layer and a second dielectric layer over the third device layer;
    the first mold compound extends beyond a top surface of the third thinned die to define a second opening within the first mold compound and over the third thinned die, wherein the top surface of the third thinned die is exposed at a bottom of the second opening; and
    the second mold compound fills the second opening and is in contact with the top surface of the third thinned die.

12. The apparatus of claim 11 further comprising at least one second support pad and at least one third support pad, wherein:
  the at least one second support pad and the at least one third support pad are on the bottom surface of the multilayer redistribution structure;
  the at least one second support pad and the at least one third support pad are electrically isolated from the plurality of package contacts and the redistribution interconnects;
  the at least one second support pad is not placed vertically below the first thinned die and not placed vertically below the third thinned die; and
  the at least one third support pad is vertically aligned with the third thinned die, such that the at least one third support pad is placed vertically below the third thinned die.

13. The apparatus of claim 11 wherein the first thinned die provides a MEMS component, the second intact die provides a CMOS controller that controls the MEMS component, and the third thinned die is formed from an SOI structure, wherein the third device layer of the third thinned die is formed from a silicon epitaxy layer of the SOI structure, and the second dielectric layer of the third thinned die is a buried oxide layer of the SOI structure.

14. The apparatus of claim 1 wherein the multilayer redistribution structure further comprises at least one structure pad, wherein:
  the at least one structure pad and the redistribution interconnects are formed from a common electrically conductive layer; and
  the at least one structure pad is vertically below the first thinned die, and electrically isolated from the redistribution interconnects and the plurality of first die contacts.

15. The apparatus of claim 1 wherein the second mold compound has a thermal conductivity greater than 2 W/m·K.

16. The apparatus of claim 1 wherein the second mold compound has an electrical resistivity greater that 1 E6 Ohm-cm.

17. The apparatus of claim 1 wherein the first mold compound is formed from a same material as the second mold compound.

18. The apparatus of claim 1 wherein the first mold compound and the second mold compound are formed from different materials.

19. The apparatus of claim 1 wherein the multilayer redistribution structure is free of glass fiber.

20. The apparatus of claim 1 wherein connections between the redistribution interconnects and the plurality of first die contacts are solder-free.

21. An apparatus comprising:
  a first thinned die comprising a first device layer and a first dielectric layer over the first device layer, wherein the first device layer comprises a plurality of first die contacts at a bottom surface of the first device layer;
  a multilayer redistribution structure comprising at least one structure pad, a plurality of package contacts, and redistribution interconnects, wherein:
    the first thinned die resides over a top surface of the multilayer redistribution structure;
    the plurality of package contacts are on a bottom surface of the multilayer redistribution structure;
    the redistribution interconnects connect the plurality of package contacts to certain ones of the plurality of first die contacts;
    the at least one structure pad and the redistribution interconnects are formed from a common electrically conductive layer; and
    the at least one structure pad is vertically below the first thinned die, and electrically isolated from the redistribution interconnects and the plurality of first die contacts;
  a first mold compound residing over the multilayer redistribution structure and around the first thinned die, and extending beyond a top surface of the first thinned die to define an opening within the first mold compound and over the first thinned die, wherein the top surface of the first thinned die is exposed at a bottom of the opening; and
  a second mold compound filling the opening and in contact with the top surface of the first thinned die.

22. A method comprising:
providing a mold wafer having a first die and a first mold compound, wherein:
  the first die comprises a first device layer, a first dielectric layer over the first device layer, and a first silicon substrate over the first dielectric layer, wherein the first device layer comprises a plurality of first die contacts at a bottom surface of the first device layer;
  a top surface of the first die is a top surface of the first silicon substrate and a bottom surface of the first die is the bottom surface of the first device layer; and
  the first mold compound encapsulates the sides and the top surface of the first die, wherein the bottom surface of the first device layer is exposed;
forming a multilayer redistribution structure underneath the mold wafer, wherein:
  the multilayer redistribution structure comprises at least one first support pad, a plurality of package contacts, and redistribution interconnects;
  the at least one first support pad is on a bottom surface of the multilayer redistribution structure and vertically aligned with the first die, such that the at least one first support pad is placed vertically below the first die;
  the plurality of package contacts are on the bottom surface of the multilayer redistribution structure; and
  the redistribution interconnects connect the plurality of package contacts to certain ones of the plurality of first die contacts, wherein the at least one first support pad is not in contact with the plurality of package contacts and the redistribution interconnects, and is electrically isolated from the plurality of package contacts, the redistribution interconnects, and the plurality of first die contacts;
thinning down the first mold compound to expose the top surface of the first silicon substrate;
removing substantially the first silicon substrate of the first die to provide a first thinned die and form an opening within the first mold compound and over the first thinned die, wherein the at least one first support pad is vertically below the first thinned die, and the first thinned die has a top surface exposed at a bottom of the opening; and
applying a second mold compound to substantially fill the opening and directly contact the top surface of the first thinned die.

* * * * *